United States Patent
Sakai

(10) Patent No.: US 9,356,222 B2
(45) Date of Patent: May 31, 2016

(54) LIQUID EJECTING HEAD, LIQUID EJECTING APPARATUS, AND PIEZOELECTRIC ELEMENT

(71) Applicant: Seiko Epson Corporation, Tokyo (JP)

(72) Inventor: Tomohiro Sakai, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/496,382

(22) Filed: Sep. 25, 2014

(65) Prior Publication Data

US 2015/0085023 A1    Mar. 26, 2015

(30) Foreign Application Priority Data

Sep. 26, 2013  (JP) ................. 2013-200460
Jun. 23, 2014  (JP) ................. 2014-128661

(51) Int. Cl.
| | | |
|---|---|---|
| *B41J 2/045* | (2006.01) | |
| *H01L 41/053* | (2006.01) | |
| *H01L 41/187* | (2006.01) | |
| *B41J 2/14* | (2006.01) | |
| *H01L 41/08* | (2006.01) | |
| *H01L 41/318* | (2013.01) | |
| *H01L 41/319* | (2013.01) | |
| *B41J 2/16* | (2006.01) | |

(52) U.S. Cl.
CPC ......... *H01L 41/053* (2013.01); *B41J 2/14233* (2013.01); *B41J 2/161* (2013.01); *B41J 2/1623* (2013.01); *B41J 2/1629* (2013.01); *B41J 2/1642* (2013.01); *B41J 2/1645* (2013.01); *B41J 2/1646* (2013.01); *H01L 41/0815* (2013.01); *H01L 41/1878* (2013.01); *H01L 41/318* (2013.01); *H01L 41/319* (2013.01); *B41J 2002/14241* (2013.01); *B41J 2002/14419* (2013.01); *B41J 2002/14491* (2013.01)

(58) Field of Classification Search
None
See application file for complete search history.

(56) References Cited

U.S. PATENT DOCUMENTS

| | | |
|---|---|---|
| 2004/0084994 A1 | 5/2004 | Iwashita et al. |
| 2005/0018019 A1* | 1/2005 | Miyazawa et al. ............... 347/68 |
| 2013/0106960 A1* | 5/2013 | Wang ............................... 347/71 |

FOREIGN PATENT DOCUMENTS

| | | |
|---|---|---|
| JP | 2011-238774 A | 11/2011 |
| JP | 2012-006182 A | 1/2012 |
| JP | 2012006182 A * | 1/2012 |

OTHER PUBLICATIONS

Extended Search Report for European Patent Application No. 14186621.0 dated Apr. 23, 2015 (6 pages).

* cited by examiner

*Primary Examiner* — Erica Lin
(74) *Attorney, Agent, or Firm* — Harness, Dickey & Pierce, P.L.C.

(57) ABSTRACT

A piezoelectric element which includes an adhesion layer made of composite oxide having perovskite structure including at least one of bismuth, manganese, iron, and titanium; a first electrode provided on the adhesion layer and made of metal preferentially oriented in a (100) face; a piezoelectric body layer provided on the first electrode and made of composite oxide having perovskite structure preferentially oriented in the (100) face; and a second electrode provided on the piezoelectric body layer.

10 Claims, 19 Drawing Sheets

ADHESION LAYER IN EXAMPLES 1 AND 3

ADHESION LAYER IN EXAMPLE 2

FIRST ELECTRODE IN EXAMPLES 1 AND 3

(200)Pt        (110)        (100)

FIRST ELECTRODE IN EXAMPLE 2

(200)Pt        (110)        (100)

PIEZOELECTRIC BODY LAYER IN EXAMPLE 1

PIEZOELECTRIC BODY LAYER IN EXAMPLE 3

PIEZOELECTRIC ELEMENT IN EXAMPLE 1

PIEZOELECTRIC ELEMENT IN COMPARATIVE EXAMPLE 1

LIQUID EJECTING HEAD, LIQUID EJECTING APPARATUS, AND PIEZOELECTRIC ELEMENT

BACKGROUND

1. Technical Field

The present invention relates to a liquid ejecting head and a liquid ejecting apparatus, each of which is provided with a piezoelectric element including a piezoelectric body layer made of a piezoelectric material and electrodes and is configured to eject liquid droplets from nozzle openings, and to the piezoelectric element.

2. Related Art

Representative examples of a liquid ejecting head include an ink jet recording head in which a part of a pressure generation chamber communicating with nozzles for ejecting ink droplets is configured of a vibrating plate and ink in the pressure generation chamber is pressurized by causing a piezoelectric element to deform the vibrating plate and is ejected as ink droplets from the nozzles. Examples of a piezoelectric element used in an ink jet recording head include a piezoelectric element configured by interposing a piezoelectric body layer made of a piezoelectric material with an electromechanical conversion function, for example, a crystallized dielectric material between two electrodes.

The piezoelectric material used in such a piezoelectric body layer is required to have an excellent piezoelectric property. In a case of a piezoelectric body layer with a crystal property of a rhombohedral system, it is desirable that the piezoelectric body layer is oriented in a (100) face in order for the piezoelectric body layer to sufficiently exhibit the piezoelectric property thereof. For example, a manufacturing method of a piezoelectric element is disclosed in which a piezoelectric body layer made of lead zirconate titanate (PZT) is formed above a lower electrode via a lead titanate layer in order to orient the lead zirconate titanate in the (100) face (see JP-A-2011-238774, for example). In addition, a technique is disclosed in which lanthanum nickel oxide (LNO) is used as a seed layer and bismuth ferrate-based and bismuth titanate-based piezoelectric body layers are preferentially oriented in the (100) face (see JP-A-2012-006182, for example).

However, a degree of orientation of the piezoelectric body layer in the vicinity of an end portion of the lower electrode is lower than that in the vicinity of the center thereof, for example, even in the piezoelectric body layer which is preferentially oriented in the (100) face, and fluctuation locally occurs in the orientation. Such fluctuation in orientation brings about degradation of the piezoelectric property.

In contrast, the piezoelectric body layer containing lead zirconate titanate or bismuth ferrate has a problem in that lead or bismuth in the piezoelectric body layer is diffused to the lower electrode and an adhesion layer provided between the vibrating plate and the lower electrode easily peels off. If such local fluctuation in orientation and peeling-off of the adhesion layer can be solved, it is possible to further enhance the piezoelectric property.

In addition, not only an actuator device which is mounted on a liquid ejecting head such as an ink jet recording head but also an actuator device which is mounted on another apparatus also has such a problem.

SUMMARY

An advantage of some aspects of the invention is to provide a piezoelectric element that is capable of preventing peeling-off of an adhesion layer and is configured to have a piezoelectric body layer preferentially oriented entirely in a (100) face, and to provide a liquid ejecting head and a liquid ejecting apparatus, each of which includes the piezoelectric element.

According to an aspect of the invention, there is provided a piezoelectric element comprising: an adhesion layer made of composite oxide having perovskite structure including at least one of bismuth, manganese, iron, and titanium; a first electrode provided on the adhesion layer and made of metal preferentially oriented in a (100) face; a piezoelectric body layer provided on the first electrode and made of composite oxide having perovskite structure preferentially oriented in the (100) face; and a second electrode provided on the piezoelectric body layer.

It is preferable that the adhesion layer contain at least bismuth, titanium, and iron, and that a molar ratio of bismuth:iron:titanium be x:65:35 where $100 \leq x \leq 120$. With such a configuration, it is possible to enhance a degree of orientation in the (100) face.

It is preferable that the adhesion layer be provided on an orientation control layer which contains bismuth and manganese, bismuth and manganese and iron, or bismuth and iron and titanium. With such a configuration, it is possible to easily and preferentially orient the adhesion layer in the (100) face.

It is preferable that the piezoelectric body layer contain bismuth, iron, barium, and titanium. With such a configuration, it is possible to enhance the degree of orientation in the (100) face. Since the piezoelectric body layer and the adhesion layer contain the same constituent element (bismuth and iron), bismuth and iron, even if diffused from the piezoelectric body layer to the adhesion layer or from the adhesion layer to the piezoelectric body layer, are taken into crystals in the adhesion layer and the piezoelectric body layer, and therefore, crystal properties of the piezoelectric body layer and the adhesion layer are not degraded. With such a configuration, peeling-off of the adhesion layer is further prevented, and the degree of orientation in the piezoelectric body layer is enhanced overall.

It is preferable that the piezoelectric body layer further contain manganese. With such a configuration, it is possible to suppress current leakage.

It is preferable that the piezoelectric body layer contain the same constituent elements as those in the adhesion layer. With such a configuration, even if the same constituent elements are diffused between the piezoelectric body layer and the adhesion layer, the diffused elements are taken into crystals in the adhesion layer and the piezoelectric body layer, and therefore, the crystal properties of the piezoelectric body layer and the adhesion layer are not degraded. With such a configuration, peeling-off of the adhesion layer is further prevented, and the degree of orientation in the piezoelectric body layer is enhanced overall.

It is preferable that the first electrode be made of platinum. With such a configuration, it is possible to obtain the first electrode with a lattice constant that satisfactorily matches that of the adhesion layer with the perovskite structure.

According to another aspect of the invention, there is provided a liquid ejecting head comprising: a flow path formation substrate which includes a pressure generation chamber communicating with nozzle openings for ejecting liquid; a vibrating plate which is provided on one side of the flow path formation substrate; and a piezoelectric element according to the above aspects. According to still another aspect of the invention, there is provided a liquid ejecting apparatus including: the liquid ejecting head according to the above aspect. According to these aspects, it is possible to obtain a liquid ejecting head or liquid ejecting apparatus provided with a piezoelectric element capable of preventing peeling-off of the adhesion layer and configured to have a piezoelectric body layer preferentially oriented entirely in the (100) face.

BRIEF DESCRIPTION OF THE DRAWINGS

Embodiments of the invention will now be described by way of example only with reference to the accompanying drawings, wherein like numbers reference like elements.

DESCRIPTION OF EXEMPLARY EMBODIMENTS

First Embodiment

Figure 1:
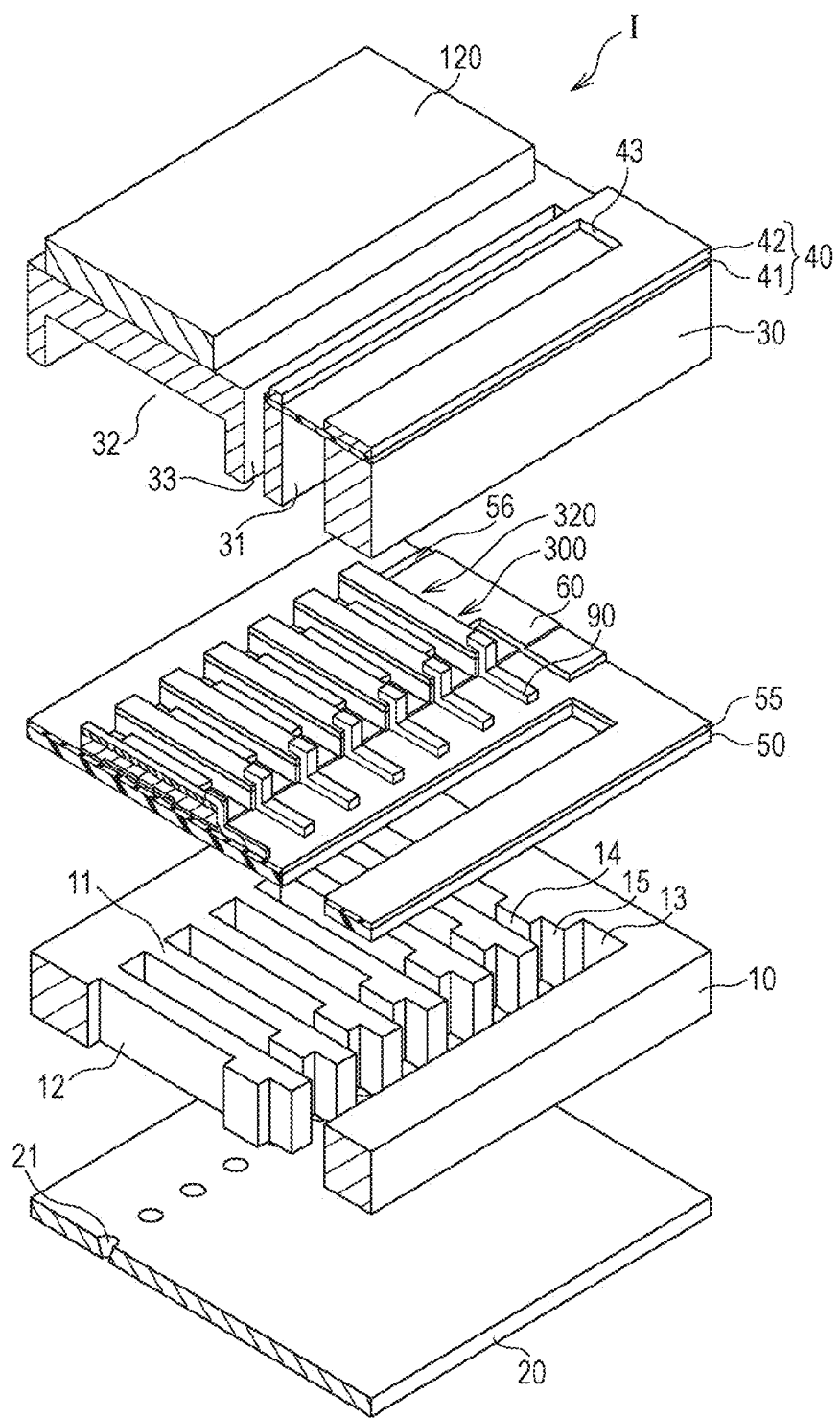
FIG. 1 is an exploded perspective view showing an outline configuration of a recording head according to a first embodiment.
Figure 2:
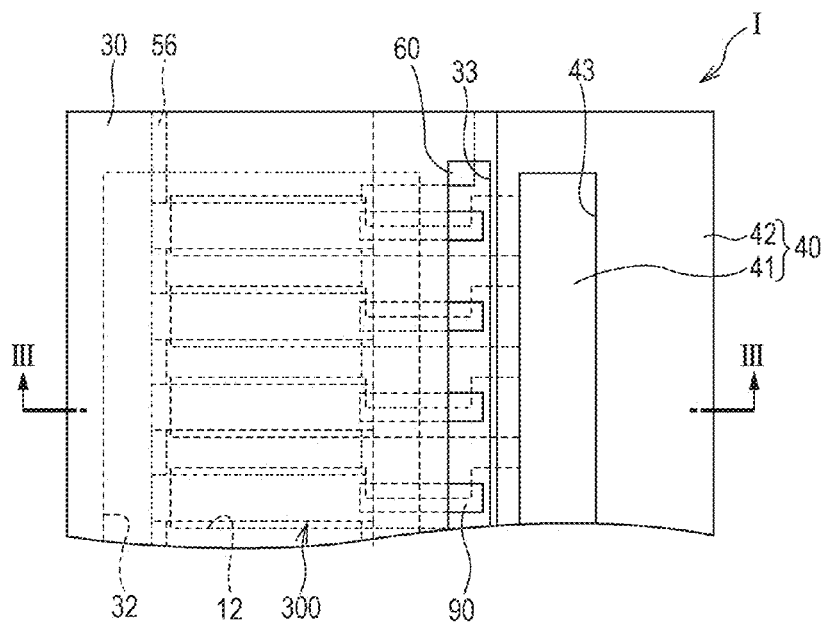
FIG. 2 is a planar view of the recording head according to the first embodiment.
Figure 3:
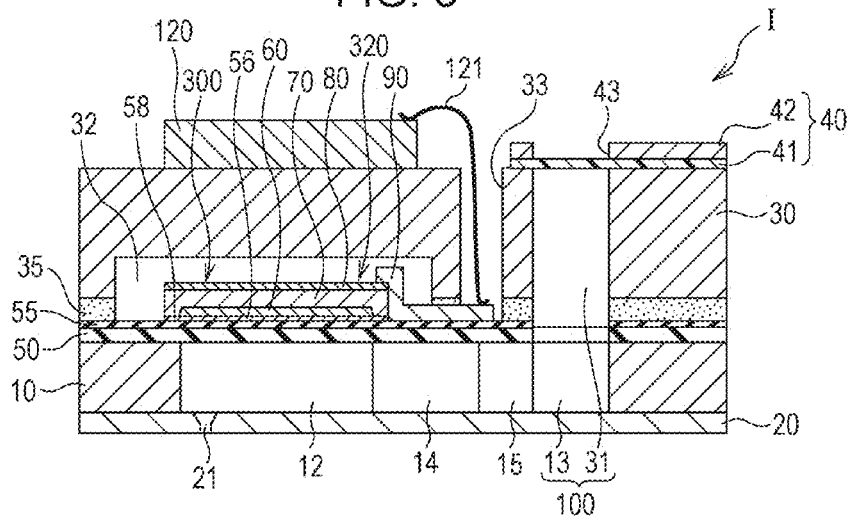
FIG. 3 is a cross-sectional view of the recording head according to the first embodiment.

FIG. 1 is an exploded perspective view showing an outline configuration of an ink jet recording head as an example of a liquid ejecting head according to a first embodiment of the invention. FIG. 2 is a planar view of FIG. 1, and FIG. 3 is a cross-sectional view taken along line III-III in FIG. 2. As shown in FIGS. 1 to 3, a flow path formation substrate 10 according to the embodiment is made of a silicon single crystal substrate, and an elastic film made of silicon dioxide is formed on one side of the surfaces thereof.

In the flow path formation substrate 10, a plurality of pressure generation chambers 12 are provided in parallel in the width direction thereof. In addition, a communication section 13 is formed in a region outside the pressure generation chambers 12 in the flow path formation substrate 10 in the longitudinal direction, and the communication section 13 and each of the pressure generation chambers 12 communicate with each other via an ink supply path 14 and a communication path 15 which are provided for each of the pressure generation chambers 12. The communication section 13 configures a part of a manifold which communicates with a manifold section 31 of a protection substrate, which will be described later, and functions as a common ink chamber for the respective pressure generation chambers 12. The ink supply path 14 is formed to have a width which is narrower than that of the pressure generation chamber 12 and constantly maintains the flow path resistance of ink which flows from the communication section 13 into the pressure generation chambers 12. Although the ink supply path 14 is formed by narrowing the width of the flow path from one side in the embodiment, the ink supply path may be formed by narrowing the width of the flow path from both sides. In addition, the ink supply path may be formed by narrowing the flow path in the thickness direction instead of narrowing the width of the flow path. According to the embodiment, the flow path formation substrate 10 is provided with a liquid flow path including the pressure generation chambers 12, the communication section 13, the ink supply paths 14, and the communication paths 15.

In addition, a nozzle plate 20 in which nozzle openings 21 communicating with the vicinity of ends of the respective pressure generation chambers 12 on the side opposite to the ink supply paths 14 are bored is fixedly attached to the flow path formation substrate 10 on a side of an opening surface with an adhesive agent, a thermal welding film, or the like. In addition, the nozzle plate 20 is made of glass ceramics, a silicon single crystal substrate, or stainless steel, for example.

In contrast, an elastic film 50 with a thickness from about 0.5 μm to about 1.0 μm, for example, which is formed of silicon dioxide as described above, is formed on such a flow path formation substrate 10 on the side opposite to the opening surface, and an insulator film 55 made of zirconium oxide ($ZrO_2$), for example, is laminated on the elastic film 50. According to the embodiment, a vibrating plate is configured of the elastic film 50 and the insulator film 55. The insulator film 55 is provided with an adhesion layer 56 as a base layer of a first electrode 60 via an orientation control layer 58 in order to enhance an adhesion property between the insulator film 55 and the first electrode 60. However, it is possible to omit the orientation control layer 58.

According to the embodiment, the adhesion layer 56 provided via the orientation control layer 58, the first electrode 60 provided on the adhesion layer 56, a piezoelectric body layer 70 provided on the first electrode 60, and a second electrode 80 provided on the piezoelectric body layer 70 are laminated and configure a piezoelectric element 300 as a pressure generation mechanism for generating variations in pressure in the pressure generation chambers 12. Here, the piezoelectric element 300 corresponds to a part which includes the orientation control layer 58 provided as necessary, the adhesion layer 56, the first electrode 60, the piezoelectric body layer 70, and the second electrode 80. In general, one of the electrodes in the piezoelectric element 300 is used as a common electrode, and the other electrode and the piezoelectric body layer 70 are patterned and configured for each of the pressure generation chambers 12. According to the embodiment, the first electrode 60 configures common electrodes which are successively provided in an alignment direction of the pressure generation chambers 12, and the second electrode 80 configures individual electrodes which are independently provided so as to correspond to the pressure generation chambers 12.

Here, the piezoelectric element 300 and the vibrating plate which is displaced by being driven by the piezoelectric element 300 are collectively referred to as an actuator device. Although the elastic film 50 and the insulator film 55 act as a vibrating plate in the above example, it is a matter of course that the invention is not limited thereto and that the elastic film 50, the insulator film 55, the orientation control layer 58, the adhesion layer 56, and the first electrode 60 may act as a vibrating plate. In addition, a configuration is also applicable in which the piezoelectric element 300 itself is made to function substantially as the vibrating plate without providing the elastic film 50 and the insulator film 55. However, in a case of providing the adhesion layer 56 on the flow path formation substrate 10 directly via the orientation control layer 58, it is preferable to protect the orientation control layer 58, the adhesion layer 56, and the first electrode 60 with a protection film or the like with an insulation property so as not to establish electric continuity between the first electrode 60 and the ink.

The orientation control layer 58 is made of composite oxide which contains at least one kind of perovskite structure selected from bismuth, manganese, iron, and titanium in one example, and it is preferable that the orientation control layer 58 be made of composite oxide which contains bismuth and manganese, bismuth and manganese and iron, or bismuth and iron and titanium. By providing the orientation control layer 58, it is possible to preferentially orient the adhesion layer 56, which is formed thereon, in the (100) face. Here, "preferentially oriented in the (100) face" means both a case where all the crystal faces are oriented in the (100) face and a case where the crystal faces are preferentially oriented in the (100) face. By orienting all the crystal faces in the (100) faces as described above or preferentially orienting the crystal faces in the (100) faces, crystal growth is promoted in the (100) face, and a satisfactory and precise crystal property is achieved. Even if a thin film which is autonomously oriented in the (100) face is provided as the orientation control layer 58, it is possible to preferentially orient the adhesion layer 56, which is formed thereon, in the (100) face. Examples of the thin film which is autonomously oriented in the (100) face include composite oxide containing bismuth, iron, and titanium. That is, the thin film which is autonomously oriented in the (100) face may be used as the orientation control layer 58 according to the embodiment as long as the thin film allows the adhesion layer 56, which is formed thereon, to be preferentially oriented in the (100) face.

However, a material of the orientation control layer 58 is not limited to the above examples, and an oxidative product which is obtained by replacing some or all of the elements such as bismuth, manganese, iron, and titanium with other elements within a range, in which a desired function can be achieved, may be used, and such an oxidative product is also included in the orientation control layer according to the invention. A material whose composition deviates from a stoichiometric composition due to a deficiency or an excess of elements (such as Bi, Mn, Fe, and Ti) even if bismuth, manganese, iron, and titanium are contained is also included in the orientation control layer 58.

Any thickness is available for the orientation control layer 58 as long as the adhesion layer 56 which is formed thereon can be preferentially oriented in the (100) face with the thickness, and the thickness thereof ranges from 5 nm to 40 nm and preferably ranges from 5 nm to 15 nm. The orientation control layer 58 with such a thickness may be provided in an island shape, for example. The "island shape" represents a state where a plurality of domains are formed so as to be separate from each other.

Orientation of the adhesion layer 56 is controlled by the orientation control layer 58 and the adhesion layer is made of composite oxide of at least one kind of perovskite structure selected from bismuth, manganese, iron, and titanium. Twelve oxygen atoms are coordinated in an A site with a perovskite structure, namely an $ABO_3$-type structure, six oxygen atoms are coordinated in a B site, and an octahedron is formed. In such a case, bismuth (Bi) is located in the A site, and manganese (Mn), iron (Fe), and titanium (Ti) are located in the B site.

By causing the adhesion layer 56 to have the perovskite structure, a lattice constant that satisfactorily matches that of metal (first electrode 60) formed thereon is achieved. With such a configuration, an adhesion property between the vibrating plate and the first electrode 60 is enhanced. In addition, the thickness of the adhesion layer 56 ranges from 10 nm to 100 nm and preferably ranges from 20 nm to 80 nm. As such an adhesion layer 56, it is possible to employ a layer which is preferentially oriented in the (100) face, for example.

The first electrode 60 provided on the adhesion layer 56 is made of metal which is preferentially oriented in the (100) face. Examples of the metal include platinum (Pt), iridium (Ir), strontium ruthenium oxide, lanthanum nickel oxide, or an alloy thereof, and in particular, platinum or iridium which has a lattice constant that satisfactorily matches that of the adhesion layer 56 with the perovskite structure is preferably used. By providing such platinum or iridium to an adhesion layer 56 which is preferentially oriented in the (100) face, platinum or iridium can easily and preferentially be oriented in the (100) face. By preferentially orienting platinum or iridium in the (100) face, it is possible to easily and preferentially orient the piezoelectric body layer 70, which is formed on the first electrode 60, in the (100) face. In the embodiment, platinum is used in the first electrode 60.

The piezoelectric body layer 70 is made of composite oxide with the perovskite structure, which contains bismuth and iron and barium and titanium, or lead and zirconium and titanium preferentially oriented in the (100) face. If the piezoelectric body layer 70 is made of composite oxide containing bismuth, iron, barium, and titanium, bismuth (Bi) and barium (Ba) are located in the A site, and iron (Fe) and titanium (Ti) are located in the B site. If the piezoelectric body layer 70 is made of composite oxide containing lead, zirconium, and titanium, lead (Pb) is located in the A site, and zirconium (Zr) and titanium (Ti) are located in the B site.

According to the invention, it is possible to obtain the piezoelectric body layer 70 which is preferentially oriented in the (100) face by directly forming the piezoelectric body layer 70 on the first electrode 60 without providing a buffer layer for controlling the orientation of the piezoelectric body layer 70, for example. Specifically, the adhesion layer 56 which is preferentially oriented in the (100) face is formed first as a base layer for the first electrode via the orientation control layer 58, and platinum (first electrode 60) which is preferentially oriented in the (100) face is then formed on the adhesion layer 56.

According to the embodiment, the adhesion layer 56 as the base layer for the first electrode 60 is formed so as to extend not only in a region where the first electrode 60 is formed but also from an end portion of the first electrode 60 to an end portion of the piezoelectric element 300 as shown in FIG. 3. With such a configuration, not only the entire region where the piezoelectric body layer 70 is formed over the first electrode 60 and the side surfaces of the first electrode 60 but also a region over the adhesion layer 56, in which the first electrode 60 is not provided, corresponds to a region of preferential orientation in the (100) face. Since the piezoelectric body layer 70 is formed over such a region, it is possible to preferentially orient the piezoelectric body layer entirely in the (100) face.

Typically, a degree of orientation in the piezoelectric body layer 70 in the vicinity of the end portion of the first electrode 60 is lower than that in the vicinity of the center of the first electrode 60, and fluctuation locally occurs in orientation. Since the piezoelectric body layer 70 is formed such that the entire region where the piezoelectric body layer 70 is formed is preferentially oriented in the (100) face, it is possible to solve such fluctuation in orientation in the piezoelectric body layer. With such a configuration, it is possible to obtain the piezoelectric body layer 70, which has a satisfactory and precise crystal property, and the entirety of which is preferentially oriented in the (100) face.

In addition, the fluctuation in orientation in the piezoelectric body layer 70 in the vicinity of the end portion and the center of the first electrode 60 appears more significantly in a case where the first electrode 60 configures the individual electrodes of the piezoelectric element 300 as in a second embodiment than in a case where the first electrode 60 configures the common electrode of the piezoelectric element 300 in this embodiment. A description will be given of the case where the first electrode 60 is configured of the individual electrodes of the piezoelectric element 300 in the second embodiment.

Since the adhesion layer 56 which is provided as the base layer of the first electrode 60, the first electrode 60, and the piezoelectric body layer 70 are all preferentially oriented in the (100) face, the crystal properties thereof are satisfactory and precise in the invention. With such a configuration, it is possible to enhance the adhesion property between the vibrating plate and the first electrode 60 and to prevent the peeling-off of the adhesion layer 56.

Such peeling-off of the adhesion layer 56 can be further prevented by causing the piezoelectric body layer 70 to contain the same constituent elements as those in the adhesion layer 56. Specifically, in a case where the piezoelectric body layer 70 contains the same elements, such as Bi and Fe, as those in the adhesion layer 56, Bi and Fi, even if diffused from the piezoelectric body layer 70 to the adhesion layer 56 or from the adhesion layer 56 to the piezoelectric body layer 70, are taken into crystals in the adhesion layer 56 and the piezoelectric body layer 70. Therefore, the crystal properties of the piezoelectric body layer 70 and the adhesion layer 56 are not degraded. With such a configuration, the peeling-off of the adhesion layer is further prevented.

In a case where the piezoelectric body layer 70 is made of composite oxide with the perovskite structure which contains bismuth, iron, barium, and titanium, it is possible to exemplify composite oxide with the perovskite structure which is configured of mixed crystals of bismuth ferrate and barium titanate and a solid solution in which bismuth ferrate and barium titanate are uniformly solid-solved. However, the invention is not limited to such a case. In addition, bismuth ferrate and barium titanate are not independently detected with the X-ray diffraction pattern.

Here, bismuth ferrate and barium titanate are individually known piezoelectric materials with perovskite structures, and bismuth ferrate and barium titanate with various compositions are known. As examples of bismuth ferrate and barium titanate, a material in which a partial deficiency or an excess of elements (Bi, Fe, Ba, Ti, and O) occurs and a material in which some of the elements are replaced with other elements are also known as well as $BiFeO_3$ and $BaTiO_3$. However, it is assumed that a material whose composition deviates from the stoichiometric composition due to a deficiency or an excess of elements and a material in which some of the elements are replaced with other elements are also included in the range of bismuth ferrate and barium titanate according to the descriptions of bismuth ferrate and barium titanate in the invention. In addition, a ratio between bismuth ferrate and barium titanate can be changed in various manners.

The composition of such a piezoelectric body layer which is made of composite oxide with the perovskite structure containing Bi, Fe, Ba, and Ti is represented as ((Bi, Ba) (Fe, Ti)$O_3$). Representative examples thereof include a mixed crystal represented by the following Formula (1). In addition, Formula (1) can also be represented by Formula (1'). Here, the descriptions of Formulae (1) and (1') are composition descriptions based on stoichiometry, and not only inevitable variations in composition due to lattice mismatch or deficient oxygen but also partial replacement of the elements are allowed as long as the perovskite structure can be achieved as described above. If it is assumed that a stoichiometric ratio is 1, for example, materials within a range from 0.85 to 1.20 are allowed. In addition, there is also a case where materials which have the same ratio between elements in the A site and elements in the B site while being represented by different formulae as will be described below are regarded as the same composite oxide.

$$(1-x)[BiFeO_3]\text{-}x[BaTiO_3] \quad (1)$$

$$(0<x<0.40)$$

$$(Bi_{1-x}Ba_x)(Fe_{1-x}Ti_x)O_3 \quad (1')$$

$$(0<x<0.40)$$

In a case where the piezoelectric body layer 70 is made of composite oxide with the perovskite structure which contains Bi, Fe, Ba, and Ti, elements other than Bi, Fe, Ba, and Ti may be further contained therein. Examples of other elements include Mn, Co, and Cr. In a case where the piezoelectric body layer 70 contains Mn, Co, or Cr, the composition of the piezoelectric body layer 70 is represented as ((1−x)[Bi(Fe$_{1-y}$, M$_y$)$O_3$]-x[BaTiO$_3$] (M represents Mn, Co, or Cr)). In such a case, the piezoelectric body layer 70 is made of the composite oxide with a structure in which Mn, Co, or Cr is located in the B site. In a case of containing Mn, for example, the composite oxide configuring the piezoelectric body layer 70 is represented as composite oxide with a structure with a part of Fe in a solid solution containing uniformly solid-solved bismuth ferrate and barium titanate or as composite oxide with the perovoskite structure of the mixed crystals of bismuth manganite ferrate and barium titanate, and the basic property thereof is the same as that of a composite oxide with the perovskite structure of the mixed crystals of bismuth ferrate and barium titanate. However, it is known that a leakage property thereof is enhanced.

In a case where the piezoelectric body layer 70 is made of composite oxide with the perovskite structure which contains lead, zirconium, and titanium, it is possible to use a ferroelectric piezoelectric material which contains lead zirconate titanate ($Pb(Zr, Ti)O_3$) as a main constituent, and a material obtained by adding a metal oxidative product such as niobium oxide, nickel oxide, or magnesium oxide to the ferroelectric piezoelectric material, for example. Specific examples include lead zirconate titanate ($Pb(Zr, Ti)O_3$), lead lanthanum zirconate titanate (($Pb,La)(Zr,Ti)O_3$), and magnesium niobate zirconium lead titanate ($Pb(Zr,Ti)(Mg,Nb)O_3$).

In addition, the thickness of the piezoelectric body layer 70 is not limited. For example, the thickness of the piezoelectric body layer 70 is equal to or less than 3 μm and preferably ranges from 0.3 μm to 1.5 μm.

To each second electrode 80 configuring each of the individual electrodes in the piezoelectric element 300, a lead electrode 90 which is drawn from the vicinity of the end portion on the side of the ink supply path 14, extends up to the elastic film 50 or the insulator film 55, and is made of gold (Au) or the like is connected.

A protection substrate 30 which includes a manifold section 31 configuring at least a part of a manifold 100 is joined above the flow path formation substrate 10 in which such a piezoelectric element 300 is formed, namely above the first electrode 60, the elastic film 50, the insulator film 55, and the lead electrode 90, via an adhesive agent 35. According to the embodiment, the manifold section 31 is formed over the width direction of the pressure generation chambers 12 so as to penetrate through the protection substrate 30 in the thickness direction and communicates with the communication section 13 in the flow path formation substrate 10 as described above to configure the manifold 100 which functions as a common ink chamber of the respective pressure generation chambers 12. In addition, a configuration is also applicable in which the communication section 13 in the flow path formation substrate 10 is divided into a plurality of parts for each of the pressure generation chambers 12 and only the manifold section 31 is used as a manifold. Furthermore, another configuration is also applicable in which only the pressure generation chambers 12 are provided in the flow path formation substrate 10 and the ink supply path 14 establishing communication between the manifold 100 and the respective pressure generation chambers 12 are provided on a member (for example, the elastic film 50 or the insulator film 55) which is interposed between the flow path formation substrate 10 and the protection substrate 30.

In a region, which faces the piezoelectric element 300, in the protection substrate 30, a piezoelectric element holding section 32 is provided with a space such that motion of the piezoelectric element 300 is not inhibited. The piezoelectric element holding section 32 may have any configuration as long as the piezoelectric element holding section 32 has a space such that the motion of the piezoelectric element 300 is not inhibited, and the space may or may not be tightly sealed.

It is preferable to use a material with substantially the same rate of thermal expansion as that of the flow path formation substrate 10, such as glass or a ceramic material, for the protection substrate 30, and the protection substrate 30 is formed by using a silicon single crystal substrate which is the same material as that of the flow path formation substrate 10 in the embodiment.

In addition, a through-hole 33 which penetrates through the protection substrate 30 in the thickness direction is provided in the protection substrate 30. In addition, the vicinity of the end portion of the lead electrode 90 which is drawn from each piezoelectric element 300 is provided so as to be exposed in the through-hole 33.

In addition, a drive circuit 120 for driving the aligned piezoelectric elements 300 is fixed to the protection substrate 30. As the drive circuit 120, it is possible to use a circuit substrate or a semiconductor integrated circuit (IC), for example. In addition, the drive circuit 120 and the lead electrode 90 are electrically connected to each other via a connection wiring 121 which is made of a conductive wire such as a bonding wire.

To such a protection substrate 30, a compliance substrate 40 which is configured of a sealing film 41 and a fixation plate 42 is joined. Here, the sealing film 41 is made of a flexible material with low rigidity, and one side surface of the manifold section 31 is sealed with the sealing film 41. In addition, the fixation plate 42 is formed of a relatively hard material. Since a region, which faces the manifold 100, in the fixation plate 42 forms an opening 43 which is completely removed in the thickness direction, the one side surface of the manifold 100 is sealed only with the flexible sealing film 41.

In the ink jet recording head I according to the embodiment, the ink is taken from an ink introduction port which is connected to an external ink supply mechanism which is not shown in the drawing, the inside from the manifold 100 to the nozzle opening 21 is filled with the ink, a voltage is applied between the first electrode 60 and the second electrode 80 corresponding to each of the pressure generation chambers 12 in response to a recording signal from the drive circuit 120, a pressure in each of the pressure generation chambers 12 is raised by causing deflection and deformation of the elastic film 50, the insulator film 55, the orientation control layer 58, the adhesion layer 56, the first electrode 60, and the piezoelectric body layer 70, and ink droplets are ejected from the nozzle opening 21.

Next, a description will be given of an example of a manufacturing method of an ink jet recording head according to the embodiment with reference to FIGS. 4A to 8B. FIGS. 4A to 8B are cross-sectional views of a pressure generation chamber in the longitudinal direction.

Figure 4A:
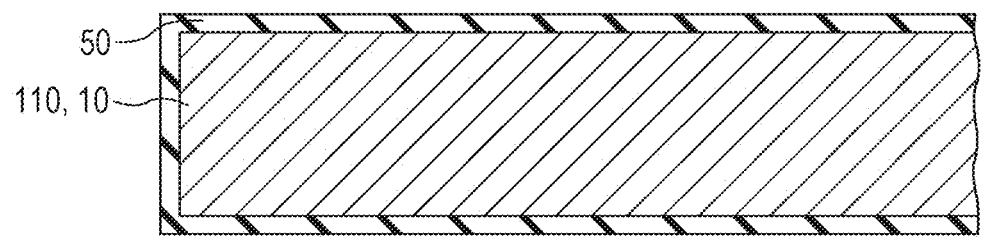
FIGS. 4A and 4B are cross-sectional views showing a manufacturing process of the recording head according to the first embodiment.
Figure 4B:
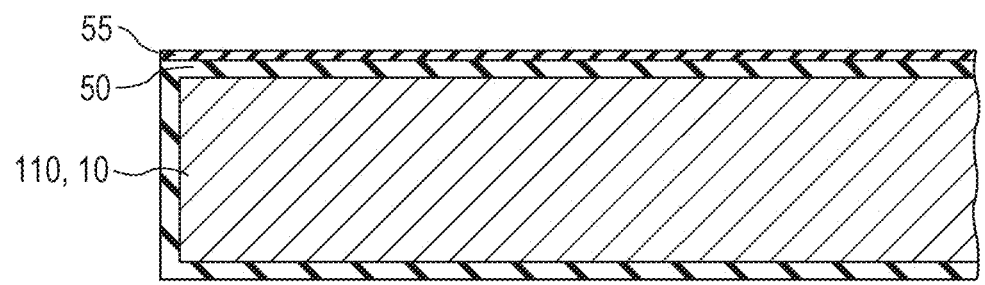

As shown in FIG. 4A, a silicon dioxide film which configures the elastic film 50 and is made of silicon dioxide ($SiO_2$) or the like is formed on the surface of a wafer 110 for the flow path formation substrate, which is a silicon wafer, by thermal oxidation. Then, the insulator film 55 made of zirconium oxide is formed on the elastic film 50 (silicon dioxide film) by a sputtering method, thermal oxidation, or the like as shown in FIG. 4B.

Figure 5A:
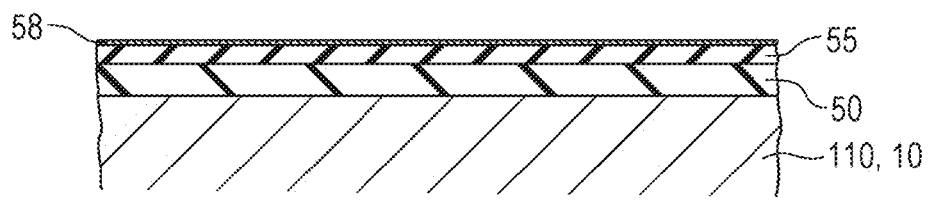
FIGS. 5A to 5D are cross-sectional views showing the manufacturing process of the recording apparatus according to the first embodiment.

Next, the orientation control layer 58 is produced on the insulator film 55 as shown in FIG. 5A. The orientation control layer 58 is made of composite oxide which contains at least one kind of perovskite structure selected from bismuth, manganese, iron, and titanium. Such an orientation control layer 58 can be produced by a chemical solution method such as a metal-organic decomposition (MOD) method in which the orientation control layer 58 is obtained by applying and drying a solution containing metal complex to form an orientation control layer precursor film (not shown) and burning the orientation control layer precursor film at a high temperature, or a sol-gel method. In addition, it is also possible to produce the orientation control layer 58 by a laser abrasion method, a sputtering method, a pulse laser deposition (PLD) method, a CVD method, an aerosol deposition method, or the like.

In a specific example of a formation procedure in a case where the orientation control layer 58 is formed by the chemical solution method, the insulator film 55 is first coated with an orientation control layer formation composition (a precursor solution of the orientation control layer) configured of a MOD solution or a solution which contains a metal complex, specifically a metal complex containing the same constituent elements as those in the orientation control layer 58 by a spin coating method or the like, and the orientation control layer precursor film (not shown) is formed (orientation control layer precursor solution application process).

In a case where the orientation control layer 58 is made of composite oxide containing Bi and Mn, Bi and Mn and Fe, or Bi and Fe and Ti, the precursor solution of the orientation control layer to be applied is obtained by mixing the metal complex capable of forming the composite oxide containing Bi and Mn, Bi and Mn and Fe, or Bi and Fe and Ti by burning and dissolving or dispersing the mixture in an organic solvent. As the metal complex which contains Bi, Mn, Fe, and Ti, it is possible to use alkoxide, organic acid salt, or β diketone complex, for example.

Examples of the metal complex containing Bi include 2-ethylhexanoic acid bismuth and bismuth acetate. Examples of the metal complex containing Mn include 2-ethylhexanoic acid manganese and manganese acetate. Examples of the metal complex containing Fe include 2-ethylhexanoic acid iron, iron acetate, and tris(acetylacetonato). Examples of the metal complex containing Ti include titanium isopropoxide, 2-ethylhexanoic acid titanium, and titanium (di-i-propoxide) bis(acetylacetonato).

It is a matter of course that a metal complex containing two or more kinds from Bi, Mn, Fe and Ti may be used. Examples of the solvent for the orientation control layer precursor solution include propanol, butanol, pentanol, hexanol, octanol, ethylene glycol, propylene glycol, octane, decane, cyclohexane, xylene, toluene, tetrahydrofuran, acetic acid, and octylic acid.

In order to produce the orientation control layer 58, it is only necessary to use the precursor solution containing the metal complex which includes the constituent elements of the orientation control layer 58, to coat the insulator film 55 with the precursor solution, and to burn the obtained object. A composition of raw materials for the precursor solution or the like is not particularly limited, and any mixture may be used such that the respective metals are contained at a desired molar ratio.

Then, the orientation control layer precursor film is heated at a predetermined temperature (from 150° C. to 200° C., for example) and is dried for a predetermined period of time (orientation control layer drying process). Then, the dried orientation control layer precursor film is heated at a predetermined temperature (from 350° C. to 450° C., for example) and is maintained for a predetermined period of time to defat the orientation control layer precursor film (orientation control layer defatting process). The defatting described herein means an operation of removing organic constituents contained in the orientation control layer precursor film as $NO_2$, $CO_2$, or $H_2O$, for example. Atmospheres for the orientation control layer drying process and the orientation control layer defatting process are not limited, and the orientation control layer drying process and the orientation control layer defatting process may be performed in the ambient air, in an oxygen atmosphere, or in inert gas.

Next, the orientation control layer precursor film is heated at a predetermined temperature, for example from about 600° C. to about 850° C., is crystallized by being maintained for one to ten minutes, for example, and the orientation control layer 58 configured of Bi and Mn, Bi and Mn and Fe, or Bi and Fe and Ti is formed (orientation control layer burning process).

An atmosphere for the orientation control layer burning process is also not limited, and the orientation control layer burning process may be performed in the ambient air, in the oxygen atmosphere, or in inert gas. Examples of a heating apparatus which is used in the orientation control layer drying process, the orientation control layer defatting process, and the orientation control layer burning process include a rapid thermal annealing (RTA) apparatus which performs heating by irradiation with an infrared lamp and a hot plate. Although the orientation control layer 58 is formed as a single layer by performing the application process once in the embodiment, the orientation control layer 58 configured of a plurality of layers may be formed.

By providing such an orientation control layer 58, it is possible to preferentially orient the adhesion layer 56 formed on the orientation control layer 58 in the (100) face. The adhesion layer 56, the crystal face of which is preferentially oriented in the (100) face, has a satisfactory and precise crystal property. With such a configuration, the adhesion property between the vibrating plate and the first electrode 60 is enhanced, and the peeling-off of the adhesion layer 56 is prevented.

Figure 5B:
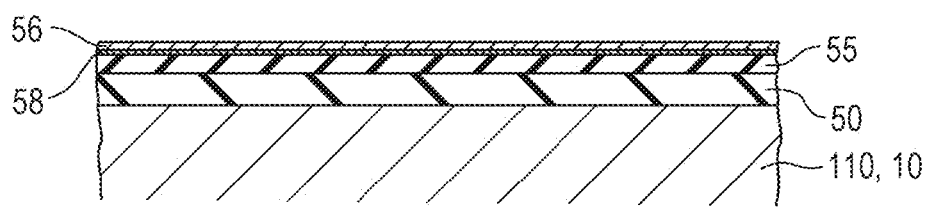

Next, the adhesion layer 56 is formed on the orientation control layer 58 as shown in FIG. 5B. The adhesion layer 56 is made of composite oxide containing at least one kind selected from bismuth, manganese, iron and titanium. Such an adhesion layer 56 can be produced by the same method as that for the aforementioned orientation control layer 58.

In a specific example of a formation procedure in a case where the adhesion layer 56 is formed by the chemical solution method, the orientation control layer 58 is first coated with an adhesion layer formation composition (a precursor solution of the adhesion layer) configured of a MOD solution or a sol which contains a metal complex containing the same constituent elements as those in the adhesion layer 56 by a spin coating method or the like, and the adhesion layer precursor film (not shown) is formed (adhesion layer precursor solution application process).

In a case where the adhesion layer 56 is made of a composite oxide containing Bi and Fe, it is only necessary to use the precursor solution which contains metal complex containing Bi and Fe, to apply the precursor solution to the orientation control layer 58, and to burn the obtained object in order to produce the adhesion layer 56. A composition of raw materials for the precursor solution of the adhesion layer 56 is not particularly limited, and any mixture may be used such that Bi and Fe are contained at a desired molar ratio. In contrast, in a case where the adhesion layer 56 is made of composite oxide containing at least Bi, Fe, and Ti, it is preferable that the molar ratio of Bi:Fe:Ti be x:65:35 and $100 \leq x \leq 120$. With such a configuration, it is possible to enhance the degree of orientation of the piezoelectric body layer 70 in the (100) face. Although the adhesion layer 56 is formed as a single layer by performing the application process once in the embodiment, the adhesion layer 56 configured of a plurality of layers may be formed. In addition, the drying process, the defatting process, and the burning process are performed in the same manner as those in the method of producing the orientation control layer 58.

Figure 5C:
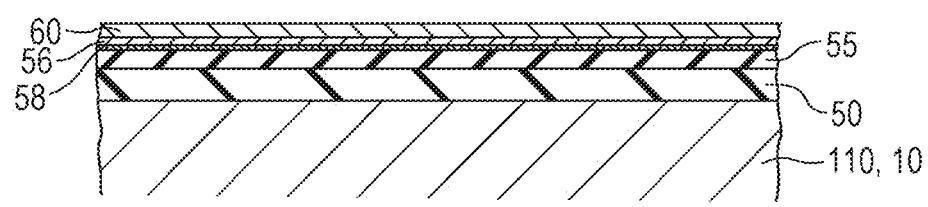

Next, the first electrode 60 made of platinum is formed on the entire surface of the adhesion layer 56 by the sputtering method, the deposition method, or the like as shown in FIG. 5C. Since the adhesion layer 56 is preferentially oriented in the (100) face, the platinum formed in the adhesion layer 56 can also be easily and preferentially oriented in the (100) face.

Figure 5D:
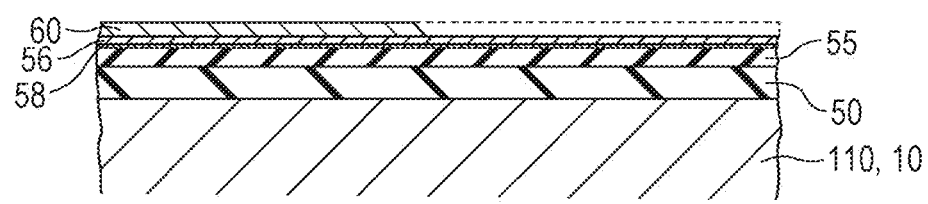

Next, a resist (not shown) with a predetermined shape is used as a mask for the first electrode 60, and patterning is performed such that the side surface of the first electrode 60 inclines as shown in FIG. 5D.

According to the embodiment, only the first electrode 60 is patterned, and the adhesion layer 56 and the like provided as bases of the first electrode 60 are not patterned and left on the entire surface of the wafer 110 for the flow path formation substrate. With such a configuration, the entire region where the piezoelectric body layer 70 is formed, namely a region above the first electrode 60, the side surface of the first electrode 60, and a region, in which the first electrode 60 is not formed, on the adhesion layer 56 correspond to a region which is preferentially oriented in the (100) face. By forming the piezoelectric body layer 70 in such a region, it is possible to preferentially orient the entire piezoelectric body layer in the (100) face.

Next, the piezoelectric body layer 70 is formed on the first electrode 60, on the side surface of the first electrode 60, and on the adhesion layer 56 at a part where the first electrode 60 is not provided. According to the embodiment, a description will be given of a case where the piezoelectric body layer 70 configured of a piezoelectric material layer 72 including a plurality of layers containing Bi, Fe, Ba, and Ti is formed. The piezoelectric material layer 72 can be produced by applying and drying a solution containing a metal complex and defatting the obtained object, for example. In addition, it is also possible to produce the piezoelectric material layer 72 by a laser abrasion method, a sputtering method, a pulse laser deposition (PLD) method, a CVD method, an aerosol deposition method, or the like.

Figure 6A:
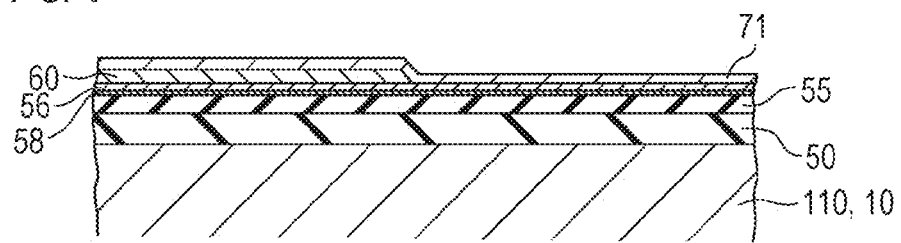
FIGS. 6A and 6B are cross-sectional views showing the manufacturing process of the recording head according to the first embodiment.

In a specific example of a formation procedure in a case where the piezoelectric material layer 72 is formed by the chemical solution method, the first electrode 60, the side surface of the first electrode 60, and the adhesion layer 56 at a part where the first electrode 60 is not provided are first coated with an oxidative product layer formation composition (a precursor solution) configured of a MOD solution or a sol which contains a metal complex, specifically a metal complex containing Bi, Fe, Ba, and Ti by a spin coating method or the like, and a precursor film (piezoelectric material precursor film) of the piezoelectric material layer 72 is formed (application process) as shown in FIG. 6A.

The precursor solution to be applied is a material obtained by mixing the metal complex capable of forming the composite oxide containing Bi, Fe, Ba, and Ti by burning and dissolving or dispersing the mixture in an organic solvent. In a case of forming the piezoelectric material layer 72 made of composite oxide containing Mn, Co, and Cr, a precursor solution containing metal complex further containing Mn, Co, and Cr is used. A rate of mixture of the metal complex containing Bi, Fe, Ba, Ti, Mn, Co, and Cr may be set such that the respective metals are included at a desired molar ratio. As the metal complex which contains Bi, Fe, Ba, Ti, Mn, Co, and Cr, it is possible to use alkoxide, organic acid salt, or β diketone complex, for example.

The metal complex which contains Bi, Fe, Ti, and Mn is the same as the aforementioned metal complex. Examples of metal complex containing Ba include barium isopropoxide, 2-ethylhexanoic acid barium, and barium acetylacetonato. Examples of an organic metal compound containing Co include 2-ethylhexanoic acid cobalt and cobalt (III) acetylacetonato. Examples of an organic metal compound containing Cr include 2-ethylhexanoic acid chromium. It is a matter of course that a metal complex containing two or more kinds from Bi, Fe, Ba, Ti, Mn, Co, and Cr may be used. In addition, examples of the solvent for the precursor solution include propanol, butanol, pentanol, hexanol, octanol, ethylene glycol, propylene glycol, octane, decane, cyclohexane, xylene, toluene, tetrahydrofuran, acetic acid, and octylic acid.

Next, the piezoelectric material precursor film 71 is heated at a predetermined temperature (150° C. to 200° C., for example) and is dried for a predetermined period of time (drying process). Then, the dried piezoelectric material precursor film 71 is heated at a predetermined temperature (350° C. to 450° C., for example) and is maintained there for a predetermined period of time to defat the piezoelectric material precursor film 71 (defatting process). The defatting described herein means an operation of removing organic constituents contained in the piezoelectric material precursor film 71 as $NO_2$, $CO_2$, or $H_2O$, for example. Atmospheres for the drying process and the defatting process are not limited, and the drying process and the defatting process may be performed in the ambient air, in an oxygen atmosphere, or in inert gas. In addition, the application process, the drying process, and the defatting process may be performed a plurality of times. The piezoelectric material precursor film 71 is heated at a predetermined temperature, for example, from about 600° C. to about 850° C. and is burned by being maintained there for one to ten minutes (burning process). By performing crystallization in such a process, the piezoelectric material layer 72 made of composite oxide with a perovskite structure which contains Bi, Fe, Ba, and Ti is obtained. An atmosphere for the burning process is also not limited, and the burning process may be performed in the ambient air, in the oxygen atmosphere, or in the inert gas. Examples of a heating apparatus which is used in the drying process, the defatting process, and the burning process include a rapid thermal annealing (RTA) apparatus which performs heating by irradiation with an infrared lamp and a hot plate.

Figure 6B:
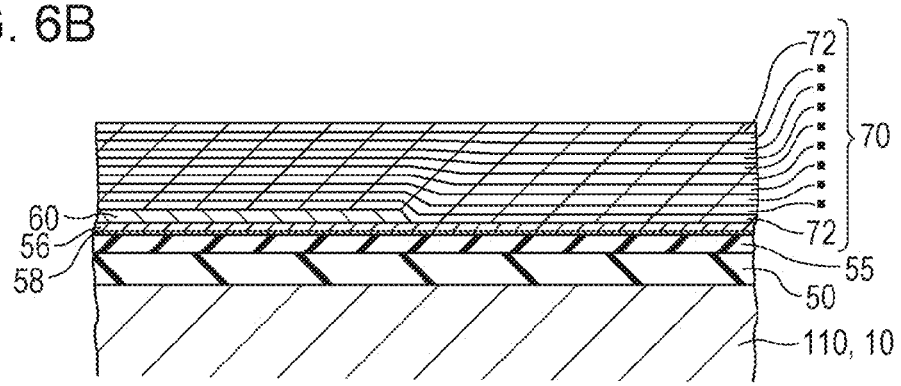

Then, the piezoelectric body layer 70 with a predetermined thickness, which is configured of the piezoelectric material layer 72 including a plurality of layers, is formed as shown in FIG. 6B by repeating the application process, the drying process, and the defatting process, which were described above, and the application process, the drying process, the defatting process, and the burning process a plurality of times in accordance with a desired film thickness or the like and forming the piezoelectric material layer 72 including the plurality of layers. In a case where a film thickness obtained by a single application of the solution is about 0.1 µm, for example, the film thickness of the entire piezoelectric body layer 70 configured of the piezoelectric material layer 72 including ten layers, for example, is about 1.0 µm. Although the piezoelectric material layer 72 is provided by laminating ten layers in the embodiment, only one layer may be included.

Figure 7A:
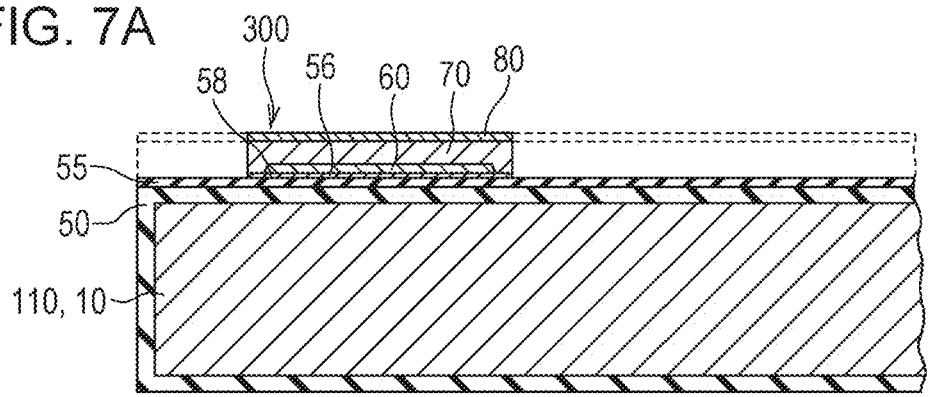
FIGS. 7A to 7C are cross-sectional views showing the manufacturing method of the recording head according to the first embodiment.

After forming the piezoelectric body layer 70, the second electrode 80 made of platinum or the like is formed on the piezoelectric body layer 70 by the sputtering method or the like, the piezoelectric body layer 70 and the second electrode 80 are simultaneously patterned in regions facing the respective pressure generation chambers 12, and the piezoelectric element 300 which includes the adhesion layer 56 provided as a base layer of the first electrode 60 via the orientation control layer 58, the first electrode 60, the piezoelectric body layer 70, and the second electrode 80 is formed as shown in FIG. 7A. The patterning of the piezoelectric body layer 70 and the second electrode 80 may be collectively performed by performing dry etching via a resist (not shown) formed into a predetermined shape. Thereafter, annealing may be performed in a temperature range from 600° C. to 850° C., for example, as necessary. With such a configuration, it is possible to form a satisfactory interface between the piezoelectric body layer 70 and the first electrode 60 or between the piezoelectric body layer and the second electrode 80 and to further enhance the crystal property of the piezoelectric body layer 70.

Figure 7B:
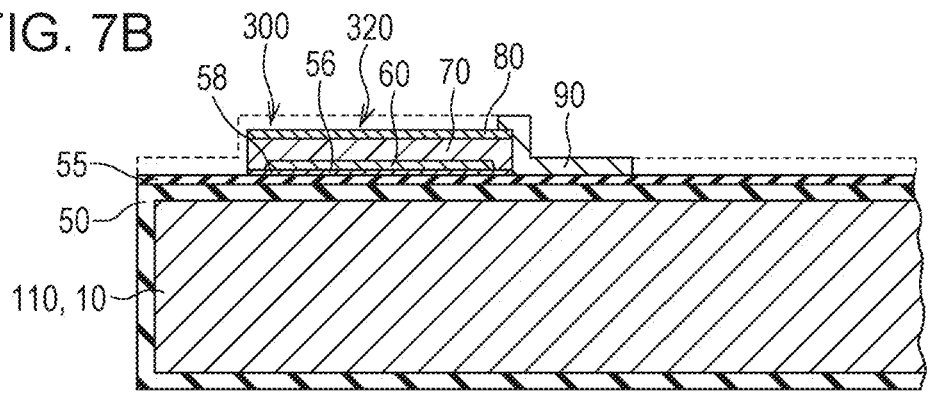

Next, the lead electrode 90 made of gold (Au) or the like is formed over the entire surface of the wafer 110 for the flow path formation substrate, and the patterning is then performed for each piezoelectric element 300 via a mask pattern (not shown) configured of a resist, for example, as shown in FIG. 7B.

Figure 7C:
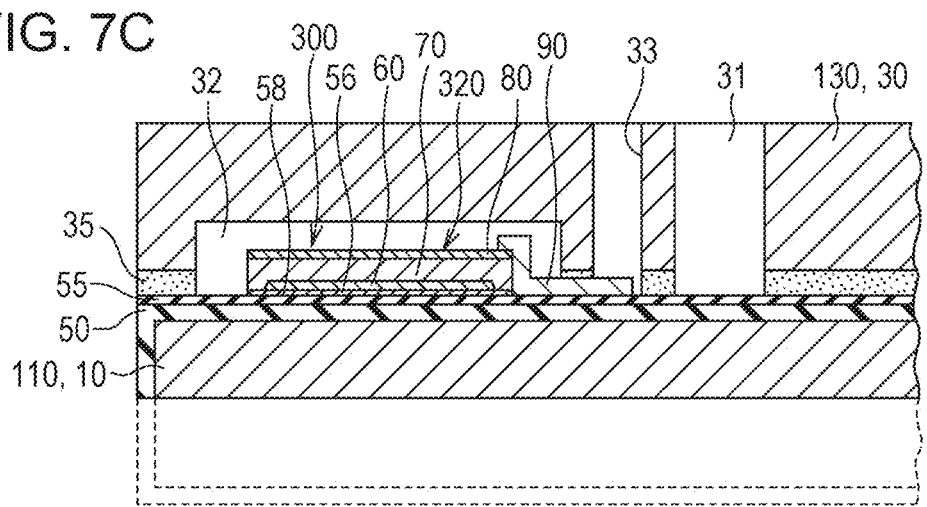

Then, a wafer 130 for a protection substrate which is a silicon wafer and is to be used as a plurality of protection substrates 30 is joined to the wafer 110 for the flow path formation substrate on the side of the piezoelectric element 300 via an adhesive agent 35, and the wafer 110 for the flow path formation substrate is then thinned to a predetermined thickness as shown in FIG. 7C.

Figure 8A:
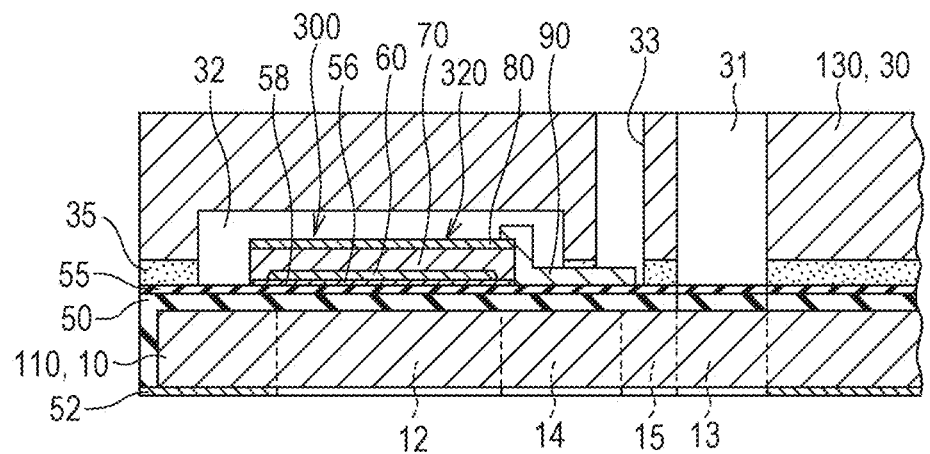
FIGS. 8A and 8B are cross-sectional views showing the manufacturing method of the recording head according to the first embodiment.
Figure 8B:
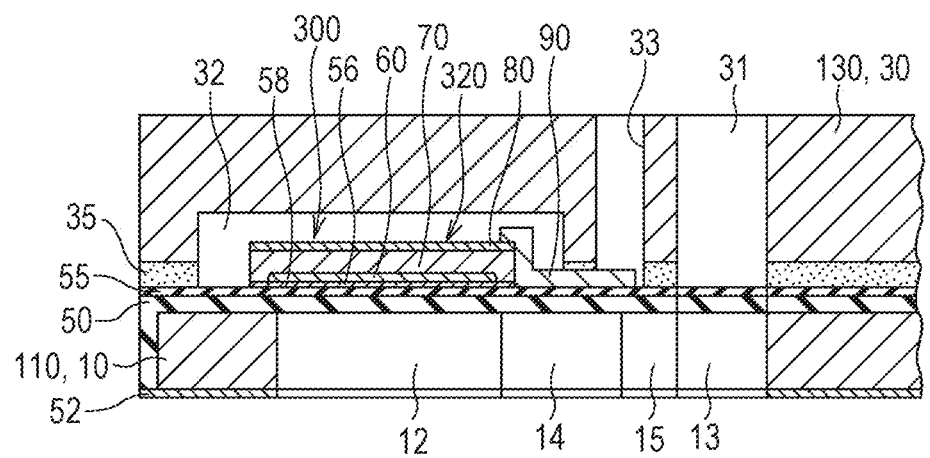

Next, a mask film 52 is newly formed on the wafer 110 for the flow path formation substrate and is patterned into a predetermined shape as shown in FIG. 8A. Then, the pressure generation chamber 12, the communication section 13, the ink supply path 14, the communication path 15, and the like corresponding to the piezoelectric element 300 are formed by performing anisotropic etching (wet etching) on the wafer 110 for the flow path formation substrate via the mask film 52 by using alkali solution such as KOH as shown in FIG. 8B.

Thereafter, unnecessary parts at outer edges of the wafer 110 for the flow path formation substrate and the wafer 130 for the protection substrate are cut and removed by dicing, for example. Then, the ink jet recording head I according to the embodiment is obtained by removing the mask film 52 from a surface, which is opposite to the side of the wafer 130 for the protection substrate, of the wafer 110 for the flow path formation substrate, then joining the nozzle plate 20 with the nozzle openings 21 bored therein, joining the compliance substrate 40 to the wafer 130 for the protection substrate, and dividing the wafer 110 for the flow path formation substrate and the like into flow path formation substrates 10 and the like, each of which has a single chip size as shown in FIG. 1.

Second Embodiment

Figure 9:
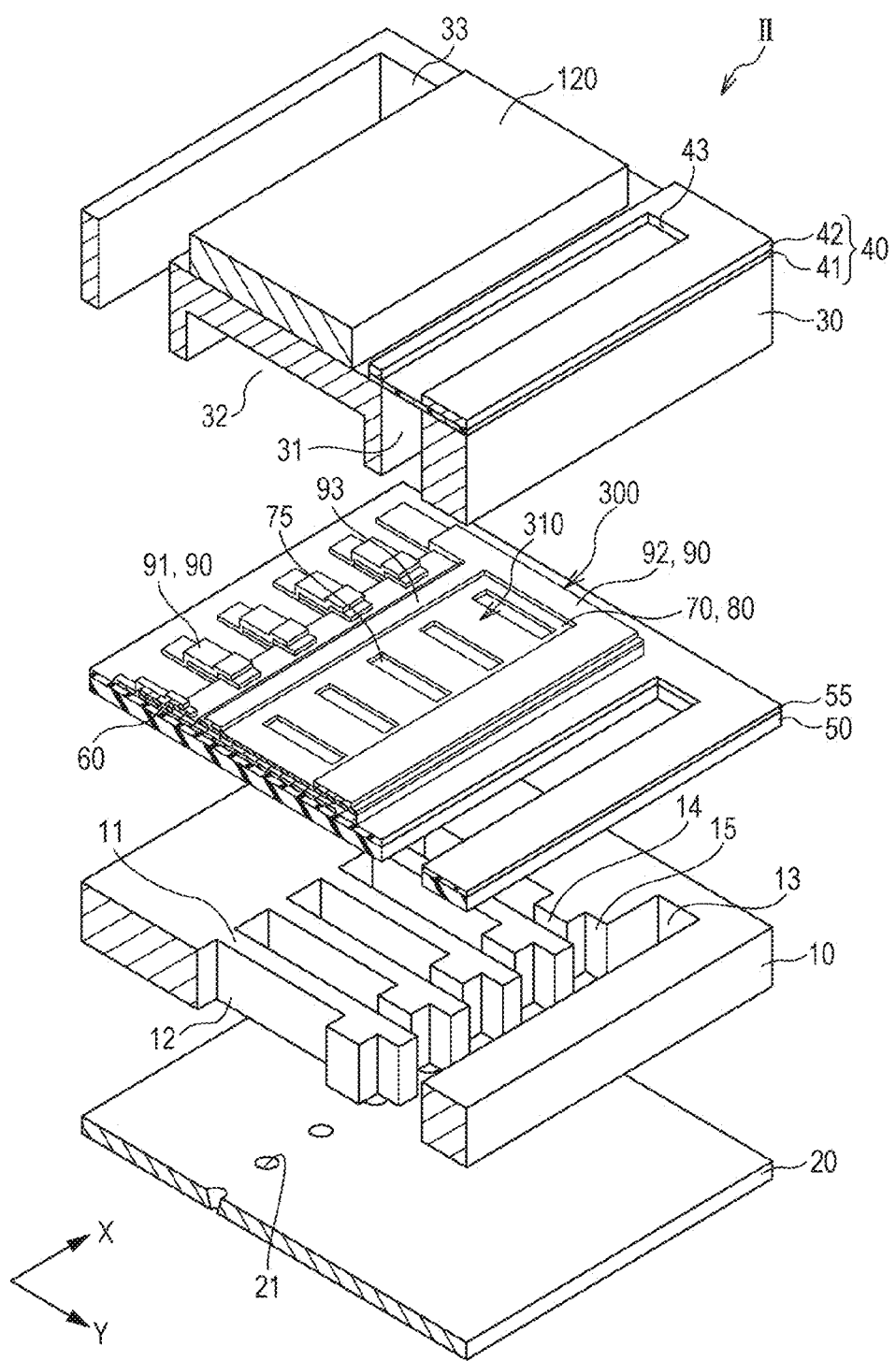
FIG. 9 is an exploded perspective view showing an outline configuration of a recording head according to a second embodiment.
Figure 10:
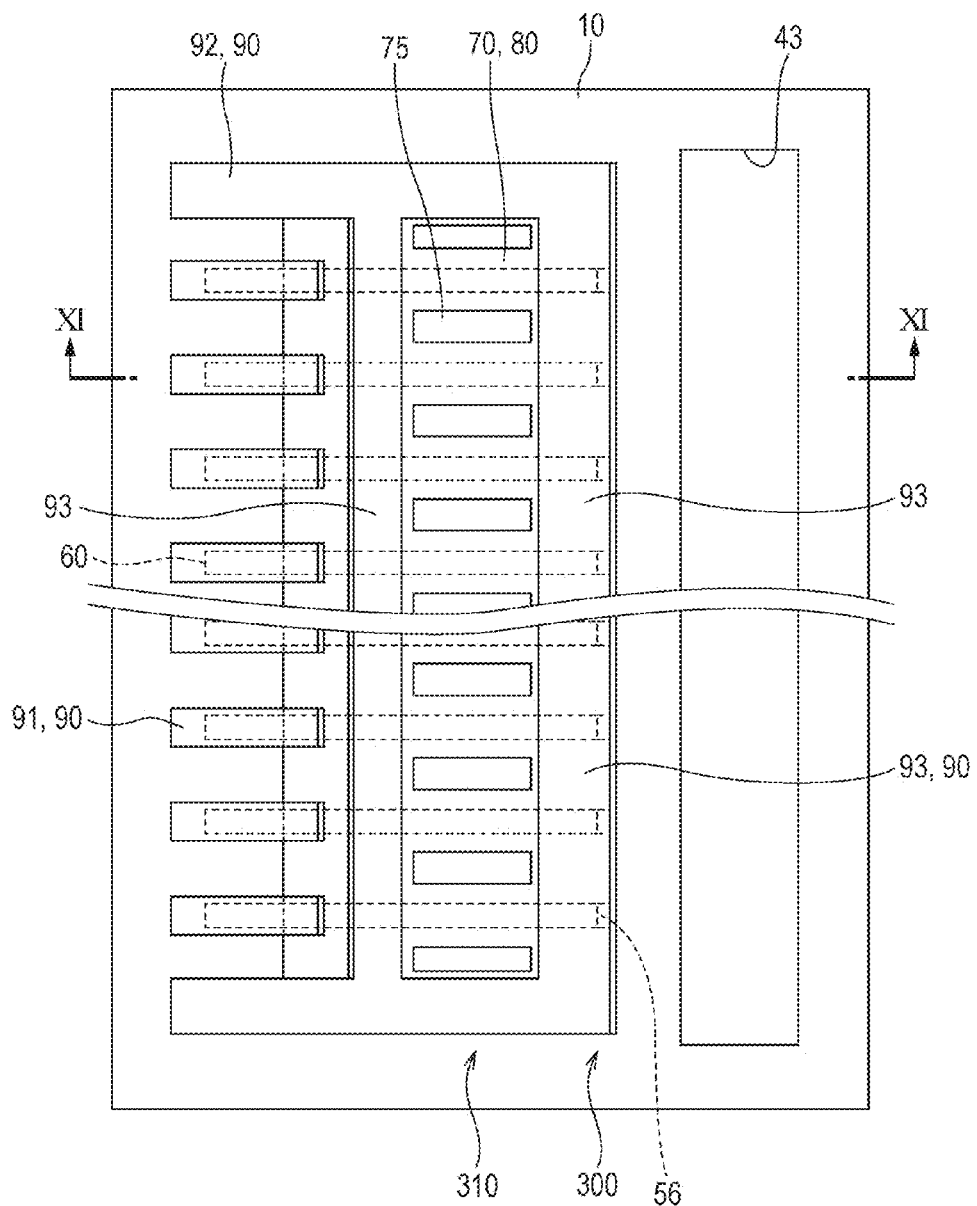
FIG. 10 is a planar view of the recording head according to the second embodiment.
Figure 11:
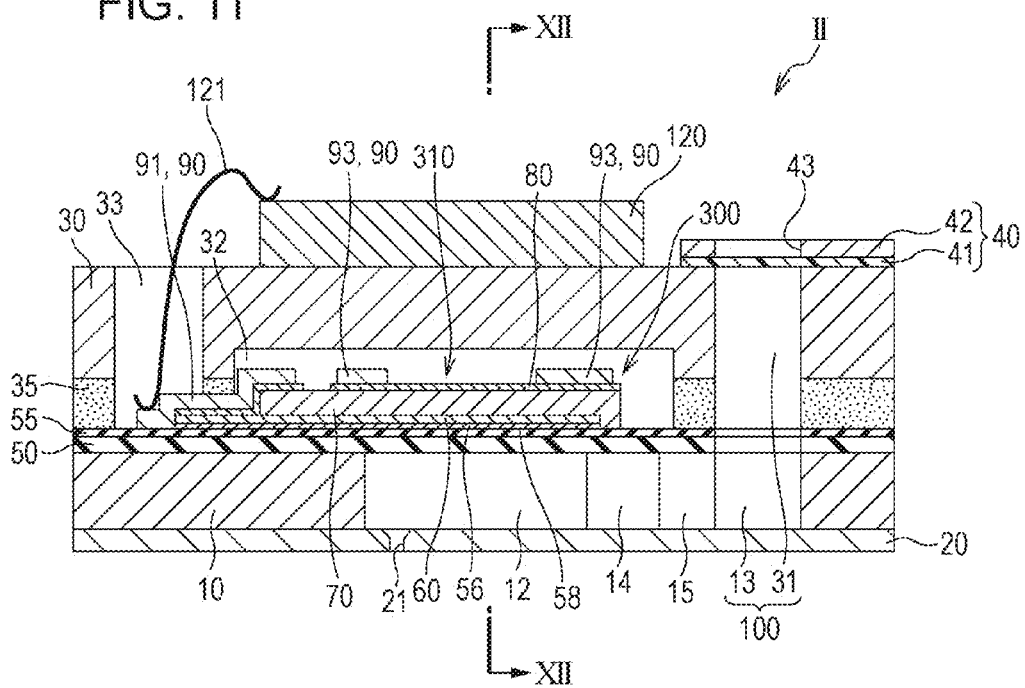
FIG. 11 is a cross-sectional view of the recording head according to the second embodiment.
Figure 12:
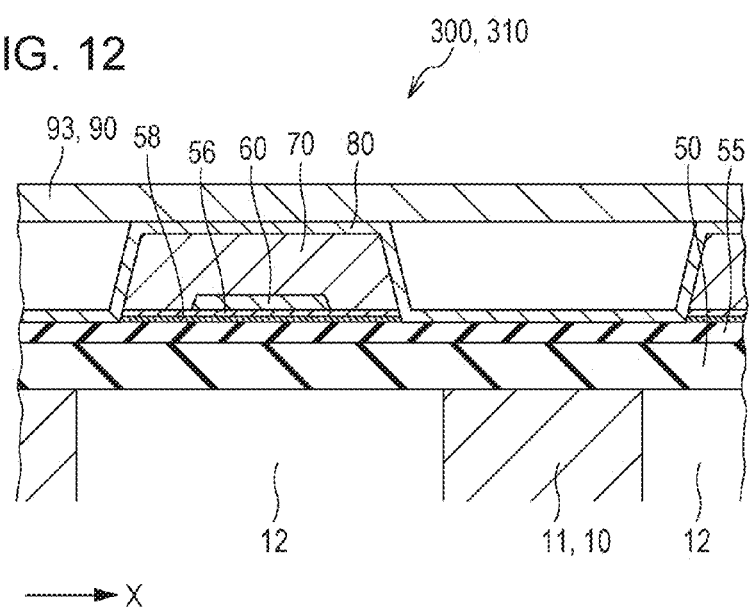
FIG. 12 is a cross-sectional view of the recording head according to the second embodiment.

FIG. 9 is an exploded perspective view showing an outline configuration of an ink jet recording head as an example of a liquid ejecting head according to a second embodiment of the invention. FIG. 10 is a planar view of FIG. 9, FIG. 11 is a cross-sectional view taken along line XI-XI in FIG. 10, and FIG. 12 is a cross-sectional view taken along line XII-XII in FIG. 11. The same reference numerals are given to the same members as those in the first embodiment, and repeated descriptions will be omitted.

As shown in FIGS. 9 to 11, the first electrode 60 which configures the piezoelectric element 300 is cut and split for each of the pressure generation chambers 12 and configures an individual electrode for each of the piezoelectric elements 300 in the second embodiment. Here, a direction in which the plurality of nozzle openings 21 are aligned will be referred to as an alignment direction of the pressure generation chambers 12 or a first direction X. In addition, a direction orthogonally intersecting the first direction X in a plane of the flow path formation substrate 10 will be referred to as a second direction Y.

The first electrode 60 is formed to have a narrower width than the width of each pressure generation chamber 12 in the first direction X of the pressure generation chambers 12. That is, an end portion of the first electrode 60 is positioned inside a region facing each pressure generation chamber 12 in the first direction X of the pressure generation chambers 12. Both end portions of the first electrode 60 extend up to the outside of each pressure generation chamber 12 in the second direction Y of the pressure generation chambers 12.

The piezoelectric body layer 70 is successively provided in the first direction X such that the width thereof in the second direction Y is a predetermined width. The width of the piezoelectric body layer 70 in the second direction Y is longer than the length of each pressure generation chamber 12 in the second direction Y. For this reason, the piezoelectric body layer 70 is provided up to the outside of the pressure generation chambers 12 in the second direction Y of the pressure generation chambers 12.

In addition, concave portions 75 which face the respective partitioning walls 11 are formed in the piezoelectric body layer 70. The width of each concave portion 75 in the first direction X is substantially the same as or longer than the width of each partitioning wall in the first direction X. That is, the piezoelectric body layer 70 is successively formed over the respective pressure generation chambers 12 along the first direction X, and the concave portions 75 are formed by removing a part of the piezoelectric body layer 70 facing the respective partitioning walls 11. Since rigidity of the vibrating plate, which is configured of the elastic film 50 and the insulator film 55, at a part facing the end portions of the pressure generation chambers 12 in the width direction (a so-called arm portion of the vibrating plate) is suppressed by the concave portions 75, it is possible to satisfactorily displace the piezoelectric element 300.

An end portion of the piezoelectric body layer 70 on a side of one end portion of each pressure generation chamber 12 in the second direction Y (on the side of the ink supply path 14 in the embodiment) is located further on an outer side than the end portion of the first electrode 60. That is, the end portion of the first electrode 60 is covered with the piezoelectric body layer 70. An end portion of the piezoelectric body layer 70 on a side of the other end portion of each pressure generation chamber 12 in the second direction Y is located further on an inner side than the end portion of the first electrode 60 (on the side of the pressure generation chambers 12).

To the first electrode 60 which extends up to the outside of the piezoelectric body layer 70, the lead electrode 90 (an individual lead electrode 91 and a common lead electrode 92) made of gold (Au), for example, is connected. Although not shown in the drawing the lead electrode 90 configures a terminal section to which a connection wiring connected to the drive circuit and the like is connected.

The individual lead electrode 91 is drawn from the first electrode 60 which is drawn to the outside of the piezoelectric body layer 70 up to the vibrating plate which is configured of the elastic film 50 and the insulator film 55. In addition, the common lead electrode 92 is drawn in the second direction Y from the second electrode 80 to the vibrating plate at both end portions in the first direction X.

In addition, the common lead electrode 92 includes an extending section 93 on wall surfaces of the pressure generation chambers 12 in the second direction Y. The extending section 93 is successively provided in the first direction X of a plurality of active portions 310 and is continued to the common lead electrode 92 at both end portions in the first direction X. That is, the common lead electrode 92 including the extending section 93 is successively arranged so as to surround the circumference of the active portions 310 in a planar view from the side of the protection substrate 30.

According to an ink jet recording head II with the above configuration, the first electrode 60 configures the individual electrodes of the piezoelectric element 300. As shown in FIG. 12, the adhesion layer 56 as a base layer for the first electrode 60 is provided so as to extend not only in the region where the first electrode 60 is provided but also in the region from the end portion of the first electrode 60 to the end portion of the piezoelectric element 300. With such a configuration, the entire region where the piezoelectric body layer 70 is formed, namely the first electrode 60, the side surface of the first electrode 60, and the entire region, in which the first electrode 60 is not provided, on the adhesion layer 56 correspond to a region which is preferentially oriented in the (100) face. Since the piezoelectric body layer 70 is formed on such a region, the piezoelectric body layer is preferentially oriented entirely in the (100) face.

Particularly, local fluctuation in orientation in the piezoelectric body layer increases in the case where the first electrode 60 configures the individual electrodes of the piezoelectric element 300 in the embodiment as compared with the case where the first electrode 60 configures the common electrode of the piezoelectric element 300 (first embodiment). This is because such fluctuation in orientation, namely a difference in degrees of orientation of the piezoelectric body layer 70 in the vicinity of the end portion and in the vicinity of the center of the first electrode 60 occurs in each of the individual electrodes.

According to the invention, the piezoelectric body layer 70 is formed after the entire region where the piezoelectric body layer 70 is formed is preferentially oriented in the (100) face, it is possible to preferentially orient the piezoelectric body layer in the (100) face entirely even in a case where such fluctuation in orientation in the piezoelectric body layer 70 occurs in each of the individual electrodes. That is, it is possible to solve the fluctuation in orientation in the piezoelectric body layer 70. In addition, since the adhesion layer 56 which is provided as a base layer for the first electrode 60, the first electrode 60, and the piezoelectric body layer 70 are all preferentially oriented in the (100) face, the adhesion layer 56, the first electrode 60, and the piezoelectric body layer 70 have satisfactory and precise crystal properties. With such a configuration, it is possible to enhance the adhesion property between the vibrating plate and the first electrode 60 and to prevent the peeling-off of the adhesion layer 56.

EXAMPLES

Hereinafter, examples will be shown, and a further specific description of the invention will be given. However, the invention is not limited to the following examples.

Example 1

First, the elastic film 50 made of silicon dioxide ($SiO_2$) with a thickness of 1300 nm was formed on the surface of a single crystal silicon (Si) substrate in the (100) face by thermal oxidation. Then, the insulator film 55 made of zirconium oxide ($ZrO_2$) with a thickness of 400 nm was formed on the elastic film 50 by the sputtering method.

Then, the orientation control layer 58 for orienting the adhesion layer 56 in the (100) face was produced on the insulator film 55. First, the insulator film 55 was coated with an orientation control layer precursor solution which was prepared to contain Bi and Mn at a molar ratio of 1:1 by the spin coating method, the obtained object was dried at 180° C. for two minutes on a hot plate, and was defatted at 350° C. for two minutes on the hot plate. Thereafter, the obtained object was burned in the oxygen atmosphere at 700° C. for two minutes. By such operations, the orientation control layer 58 made of a composite oxide with the perovskite structure which contained Bi and Mn was obtained.

Then, the adhesion layer 56 was produced on the orientation control layer 58. First, the orientation control layer 58 was coated with an adhesion layer precursor solution which was produced to contain Bi and Fe at a molar ratio of 1:1 by the spin coating method, and the obtained object was dried at 180° C. for two minutes on the hot plate and was defatted at 350° C. for two minutes on the hot plate. Thereafter, the obtained object was burned at 700° C. for two minutes in the oxygen atmosphere. With such operations, the adhesion layer 56 with the thickness of 80 nm, which was made of composite oxide with the perovskite structure containing Bi and Fe, was obtained.

The film of the first electrode 60 with the thickness of 100 nm, which was made of platinum (Pt), was formed on the adhesion layer 56 under conditions of RF 150 W, 600° C., 0.4 Pa, and oxygen of 40 sccm by the sputtering method, and patterning of Pt was performed by photo processing and etching processing.

Then, the piezoelectric body layer 70 configured of the piezoelectric material layer 72 including eleven layers was produced on the first electrode 60. The procedure is as follows. First, a precursor solution was prepared by mixing n-octane solutions of 2-ethylhexanoic acid bismuth, 2-2-ethylhexanoic acid barium, 2-ethylhexanoic acid iron, 2-ethylhexanoic acid titanium, and ethylhexanoic acid manganese such that the respective elements are contained at a molar ratio Bi:Ba:Fe:Ti:Mn=75:25:71.25:25:3.75.

Then, the first electrode 60 was coated with the precursor solution by the spin coating method, and a piezoelectric material precursor film 71 was formed (application process). Then, the obtained object was dried at 180° C. for two minutes on the hot plate (drying process) and was defatted at 350° C. for two minutes on the hot plate (defatting process). Thereafter, the obtained object was burned at 750° C. for two minutes in the oxygen atmosphere by the RTA apparatus (burning process), and a single-layered piezoelectric body layer 70 made of the piezoelectric material layer 72 was obtained.

Thereafter, the application process, the drying process, and the defatting process were repeated twice, and the obtained object was burned at 750° C. in the oxygen atmosphere by the RTA apparatus. Then, the piezoelectric body layer 70 configured of the piezoelectric material layer 72 including eleven layers was formed by repeating a set of combination process, which is comprised of combination of the application process, the drying process, and the defatting process twice and the burning process once, five times. With such operations, the piezoelectric body layer 70 with the entire thickness of 900 nm was produced.

The film of the second electrode 80 made of platinum (Pt) with the thickness of 100 nm was formed under conditions of RF 300 W, 25° C., 0.4 Pa, and oxygen of 40 sccm by the sputtering method, and patterning of Pt was performed by photo etching.

Then, the protection film made of aluminum oxide was formed in the patterning region of the piezoelectric body layer 70 and the second electrode 80 by the CVD method, and the patterning of the protection film was performed by performing the photo etching. Then, a protection film was attached to the rear surface of the single crystal silicon substrate, and the obtained object was polished. Thereafter, patterning of the protection film was performed by performing photo processing and performing etching processing with a KOH solution.

By such operations, the piezoelectric element 300 which was provided with the orientation control layer 58, the adhesion layer 56, the first electrode 60, the piezoelectric body layer 70, and the second electrode 80 was obtained.

Example 2

In Example 2, the piezoelectric element 300 was produced by the same procedure as that in Example 1 except that the piezoelectric body layer 70 with the thickness of about 900 nm, which was configured of a single-layered piezoelectric material layer 72, was formed.

Example 3

In Example 3, the piezoelectric element 300 was produced by the same procedure as that in Example 1 except that a composite oxide containing Pb, Zr, and Ti was produced as the piezoelectric body layer 70.

In producing the piezoelectric body layer 70, butyl cellosolve solvents of lead acetate trihydrate, titanium isopropoxide, and zirconium acetylacetonato were mixed as a precursor solution such that the respective elements were contained at a molar ratio of Pb:Ti:Zr=1.10:0.44:0.56, and a mixture of diethanol amine as a stabilizer and polyethylene glycol as a thickening agent was used. The piezoelectric element 300 was produced by the same procedure as that in Example 1 except for this point.

Comparative Example 1

In comparative Example 1, the piezoelectric element 300 was produced by the same procedure as that in Example 1 except that a $TiO_2$ film with the thickness of 20 nm was produced as the adhesion layer by producing titanium (Ti) on the insulator film by the sputtering method and burning the obtained object at 750° C. in the oxygen atmosphere. The $TiO_2$ film in Comparative Example 1 did not have the perovskite structure.

Test Example 1

As for the adhesion layers and the first electrodes (Pt) in Examples 1 to 3 and the piezoelectric body layers in Examples 1 and 3, "D8 Discover" manufactured by Bruker AXS was used to measure two-dimensional mappings in a case of using an X-ray diffraction two-dimensional detector. FIGS. 13A to 14B respectively show two-dimensional mappings of the adhesion layers and the first electrodes (Pt) in Examples 1 to 3, and FIGS. 15A and 15B show two-dimensional mappings of the piezoelectric body layers in Examples 1 and 3. The two-dimensional mappings of both the piezoelectric body layers in Examples 1 and 3 were measured after producing a single-layered piezoelectric body layer.

First, a description will be given of the two-dimensional mappings. The two-dimensional mappings shown in FIGS. 13A to 15B were obtained by fixing a position 2θ of the two-dimensional detector at 35° and changing an angle of a sample. In addition, a position at which a diffraction peak was obtained was a position of 2θ=about 22.4° in a case of the (100) face, a position of 2θ=about 31.8° in a case of a (110) face, and a position of 2θ=about 38.2° in a case of a (111) face.

From such two-dimensional mappings, it is possible to determine orientation in the adhesion layer with the perovskite structure, the first electrode (Pt), and the piezoelectric body layer. A specific description will be given of an example of a method of determining orientation in the (100) face. The following determination method can be similarly applied to the (110) face and the (111) face.

When the adhesion layer with the perovskite structure, the first electrode, and the piezoelectric body layer are randomly oriented, or preferentially oriented in the (100) face, or when both the random orientation and the preferential orientation are present according to the two-dimensional mappings, a case where a ring-shaped diffraction line with uniform intensity is observed around 2θ=22°, in which a diffraction line in the (100) face of the perovskite is observed, corresponds to a case of the random orientation. In addition, a case where a spot-shaped diffraction line is observed around the center corresponds to a case of the preferential orientation in the (100) face. Furthermore, a case where a ring-shaped diffraction line with uniform intensity is observed near an outer peripheral part and a spot-shaped diffraction line is observed near the center corresponds to a case where the random orientation and the preferential orientation in the (100) face coexist. In contrast, when there is another face of preferential orientation, there is a case where spots appear at locations other than the center on a line, along which the ring appears in the case of the random orientation. That is, the case of the preferential orientation in the (100) face corresponds to the case where the spot-shaped diffraction line is observed around the center in the vicinity of 2θ=22°. In evaluating orientation, the same operation was performed for the respective faces.

Figure 13A:
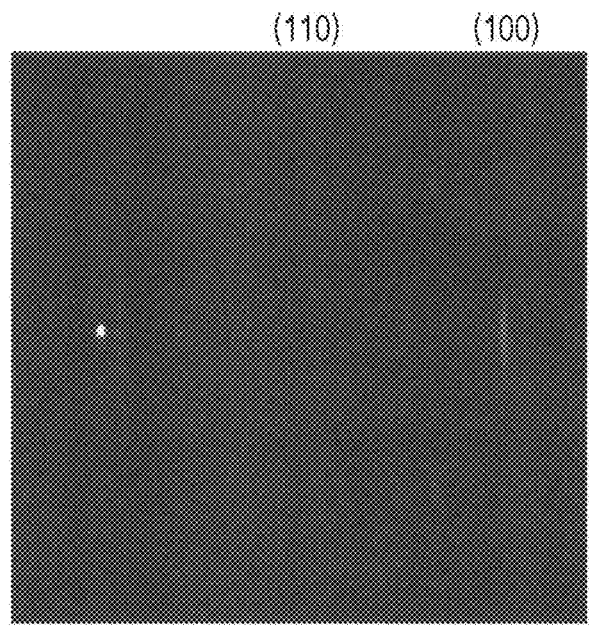
FIGS. 13A and 13B show two-dimensional mappings of adhesion layers in Examples 1 and 3 and in Example 2.
Figure 13B:
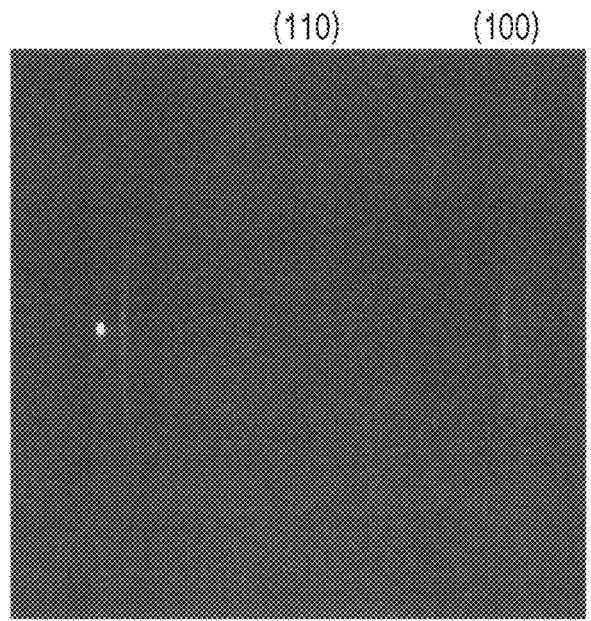

As shown in FIGS. 13A and 13B, spot-shaped diffraction lines were observed at the centers at locations indicating orientation in the (100) face in the perovskite, and diffraction lines indicating orientation in the (110) face were not observed in the adhesion layers in Examples 1 to 3. Therefore, it was possible to understand that the adhesion layers in Examples 1 to 3 were preferentially oriented in the (100) face.

Figure 14A:
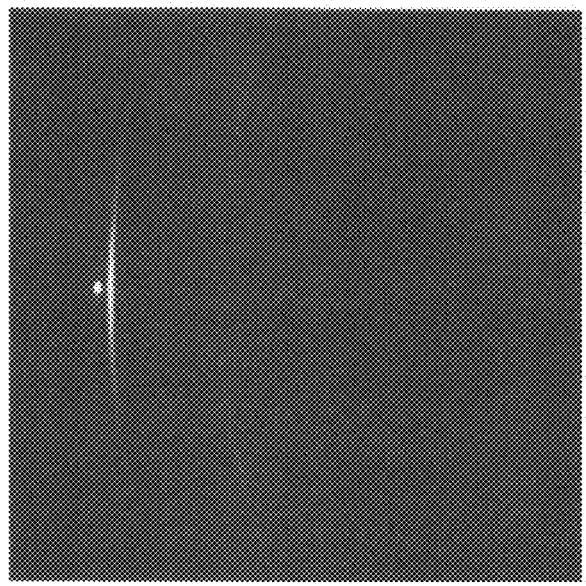
FIGS. 14A and 14B show two-dimensional mappings of first electrodes in Examples 1 and 3 and in Example 2.
Figure 14B:
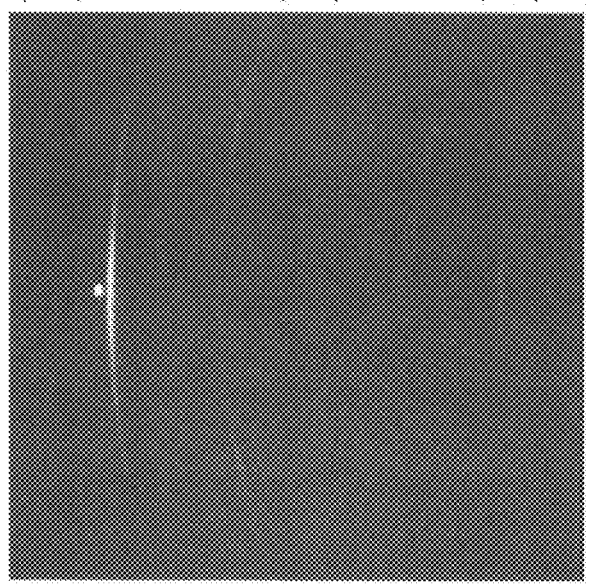
Figure 15A:
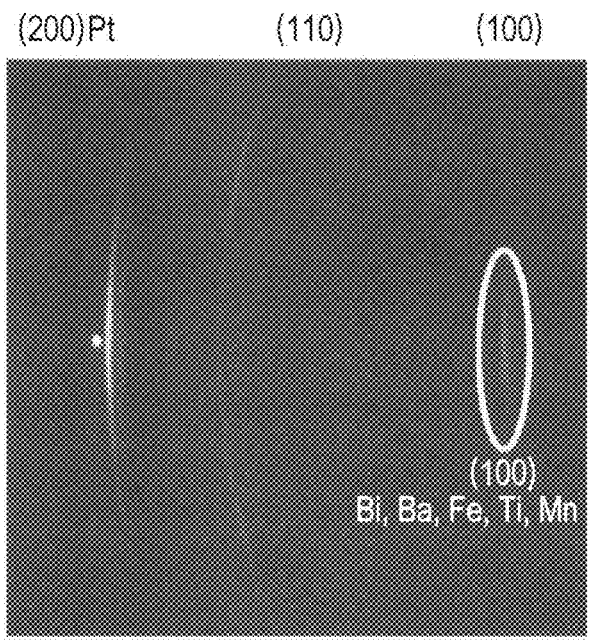
FIGS. 15A and 15B show two-dimensional mappings of piezoelectric body layers in Examples 1 and 3.
Figure 15B:
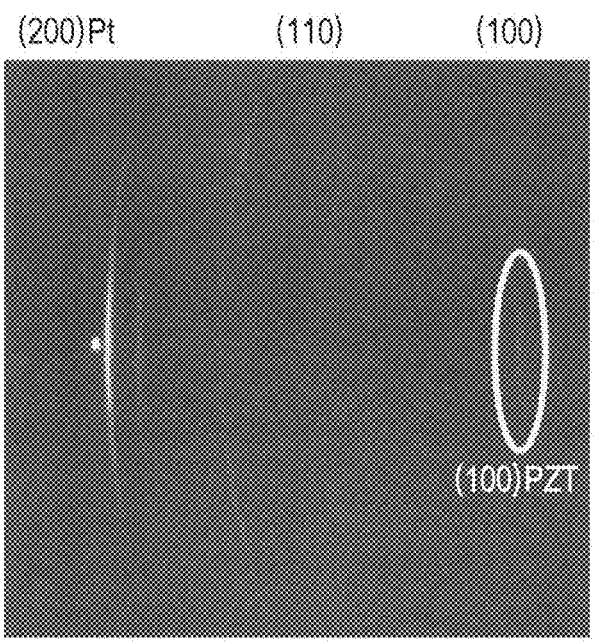

As shown in FIGS. 14A and 14B, spot-shaped diffraction lines were clearly observed at the centers at locations indicating orientation in the (200) face, and diffraction lines indicating orientation in the (110) face were not observed in the first electrodes (Pt) in Examples 1 to 3. Therefore, it was possible to understand that the first electrodes (Pt) in Examples 1 to 3 were preferentially oriented in the (100) face which was a face equivalent to the (200) face.

As shown in FIGS. 15A and 15B, diffraction lines of the (200) orientation indicating Pt were observed, spot-shaped diffraction lines were observed at the centers at locations indicating the (100) orientation of the perovskite, however, diffraction lines indicating orientation in the (110) face were not observed in the piezoelectric body layers in Examples 1 and 3. Therefore, it was possible to understand that, the piezoelectric body layers were preferentially oriented in the (100) face both in the case where the piezoelectric body layer was made of composite oxide containing Bi, Ba, Fe, Ti, and Mn and in the case where the piezoelectric body layer was made of composite oxide containing Pb, Zr, and Ti.

Based on the above results, it was possible to understand that it was possible to preferentially orient the adhesion layer in the (100) face by using the orientation control layer made of composite oxide containing Bi and Mn, that it was possible to preferentially orient the first electrode in the (100) face by forming the first electrode on such an adhesion layer, and that it was possible to preferentially orient the piezoelectric body layer entirely in the (100) face by forming the piezoelectric body layer on the first electrode. It is considered to be possible to obtain a satisfactory and precise crystal property for the entire laminated body configured of the adhesion layer, the first electrode, and the piezoelectric body layer and to solve fluctuation in orientation in the piezoelectric body layer by preferentially orienting the entire laminated body in the (100) face as described above. Therefore, it is possible to further enhance the piezoelectric property. Since the satisfactory and precise crystal property of the entire laminated body can be achieved, the peeling-off of the adhesion layer is prevented as in Test Example 2 which will be described below.

Test Example 2

Figure 16:
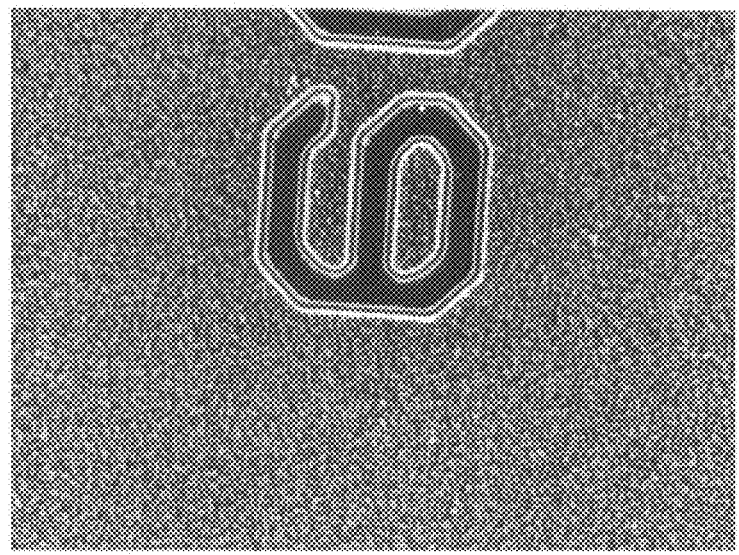
FIG. 16 is a microscope photograph of a piezoelectric element after performing rear surface processing on a silicon substrate in Example 1.

The piezoelectric elements in Example 1 and Comparative Example 1 were subjected to rear surface processing of the silicon substrates and to microscopic observation. FIG. 16 shows a microscope photograph of the piezoelectric element in Example 1, and FIG. 17 shows a microscope photograph of the piezoelectric element in Comparative Example 1.

As shown in FIG. 16, peeling-off was not observed in all of the laminated films, namely the orientation control layer, the adhesion layer, the first electrode, the piezoelectric body layer, and the second electrode in the piezoelectric element in Example 1.

Figure 17:
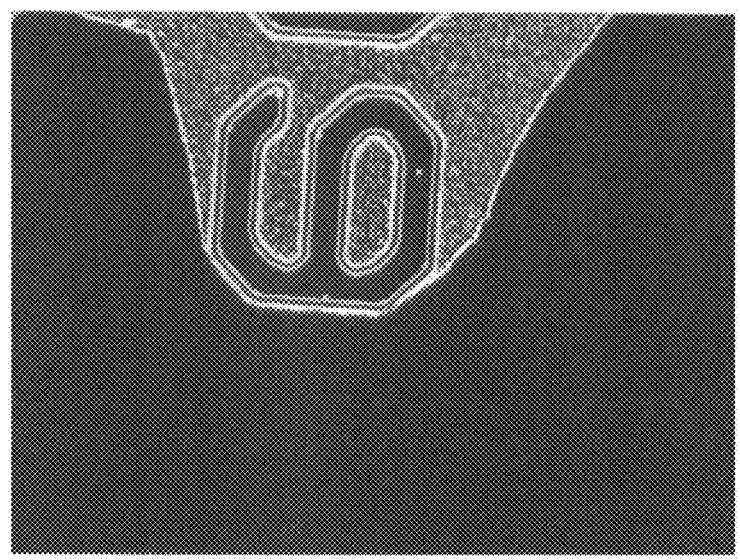
FIG. 17 is a microscope photograph of a piezoelectric element after performing the rear surface processing on a silicon substrate in Comparative Example 1.

In contrast, the $TiO_2$ film was exposed at a patterning part where Pt of the first electrode was present, and peeling-off was observed in the piezoelectric element in Comparative Example 1 as shown in FIG. 17.

Accordingly, it was possible to understand that a satisfactory and precise crystal property of the entire laminated body configured of the adhesion layer, the first electrode, and the piezoelectric body layer was achieved and peeling-off of the adhesion layer was prevented by preferentially orienting the entire laminated body in the (100) face, based on the result in Test Example 2 and the aforementioned result in Test Example 1.

In addition, the piezoelectric element in Example 1, which was used in Test Example 2, was provided with the adhesion layer and the piezoelectric body layer which contain the same elements (Bi and Fe). For this reason, Bi, if diffused between the piezoelectric body layer and the adhesion layer, is taken into the respective crystals, and therefore, the crystal properties of the piezoelectric body layer and the adhesion layer are not degraded. It is considered that the peeling-off of the adhesion layer was reliably prevented as a result.

According to the invention, a piezoelectric element capable of preferentially orienting the entire piezoelectric body layer in the (100) face and preventing the peeling-off of the adhesion layer is provided, and therefore, it is possible to realize a reliable liquid ejecting head, a liquid ejecting apparatus, and a piezoelectric element with excellent piezoelectric properties.

The orientation control layer 58 is not necessarily provided in the aforementioned piezoelectric elements in Examples 1 to 3, and constituent materials of the adhesion layer 56 are not limited to those in Examples 1 to 3. Hereinafter, the following examples will be described while the same parts as those in Examples 1 to 3 are appropriately omitted.

Example 4

Production of Substrate

The insulator film 55 made of zirconium oxide ($ZrO_2$) was formed on the same single crystal silicon (Si) substrate as that in Example 1 by the same method as that in Example 1, and the surface shape of the insulator film 55 was arranged so as to be able to preferentially orient the first electrode 60, which was to be formed via the adhesion layer 56 in the later process, in the (100) face.

Formation of Adhesion Layer

By the following process which was basically the same method as that in Example 1, the adhesion layer 56 was formed. That is, the insulator film 55 was coated with a precursor solution, which was produced so as to satisfy a molar ratio of Bi:Fe:Ti=110:X:Y and X+Y=100, by the spin coating method, and the obtained object was dried at 180° C. for two minutes on the hot plate. Thereafter, the obtained object was defatted at 350° C. for two minutes on the hot plate. Then, the obtained object was burned at 700° C. for two minutes in the oxygen atmosphere, and the adhesion layer 56 was produced.

Formation of First Electrode, Piezoelectric Body Layer, and Second Electrode

Thereafter, the first electrode 60, the piezoelectric body layer 70 configured of $BiFeO_3$ and $BaTiO_3$, and the second electrode 80 were formed on the adhesion layer 56, and the piezoelectric element in Example 4 was produced.

Examples 5 to 9

Piezoelectric elements in Examples 5 to 9 were produced by the same method as that in Example 4 other than that the values X and Y in Fe:Ti=X:Y were changed as in Table 1.

Examples 10 to 13

Piezoelectric elements in Examples 10 to 13 were produced by the same method as that in Example 4 other than that the value of x in the molar ratio of Bi:Fe:Ti=x:65:35 was changed within a range of 100≤x≤120 around the value in Example 6 (the molar ratio Bi:Fe:Ti=110:65:55 in the adhesion layer 56), as in Table 2.

Example 14

The first electrode 60, the piezoelectric body layer 70 configured of Pb(Zr, Ti)$O_3$, and the second electrode 80 were formed on the adhesion layer 56 by the same method as that in Example 3 after producing the adhesion layer 56 by the same method as that in Example 6 (the molar ratio Bi:Fe:Ti=110:65:55 in the adhesion layer 56), and a piezoelectric element in Example 14 was produced.

Molar ratios of Bi:Fe:Ti in the adhesion layers 56 and the piezoelectric body layers were as shown in Tables 1 and 2. In the tables, $BiFeO_3$ and $BaTiO_3$ representing the piezoelectric body layer will be abbreviated as BFM-MT, Pb(Zr, Ti)$O_3$ will be abbreviated as PZT, and correspondence with the following test results will also be shown. The following tests shown in FIGS. 18A to 19B were conducted by measurement in a stage after the formation of the adhesion layer, that is, in a stage prior to the production of the first electrode and the piezoelectric body layer.

TABLE 1

Figure 18A:
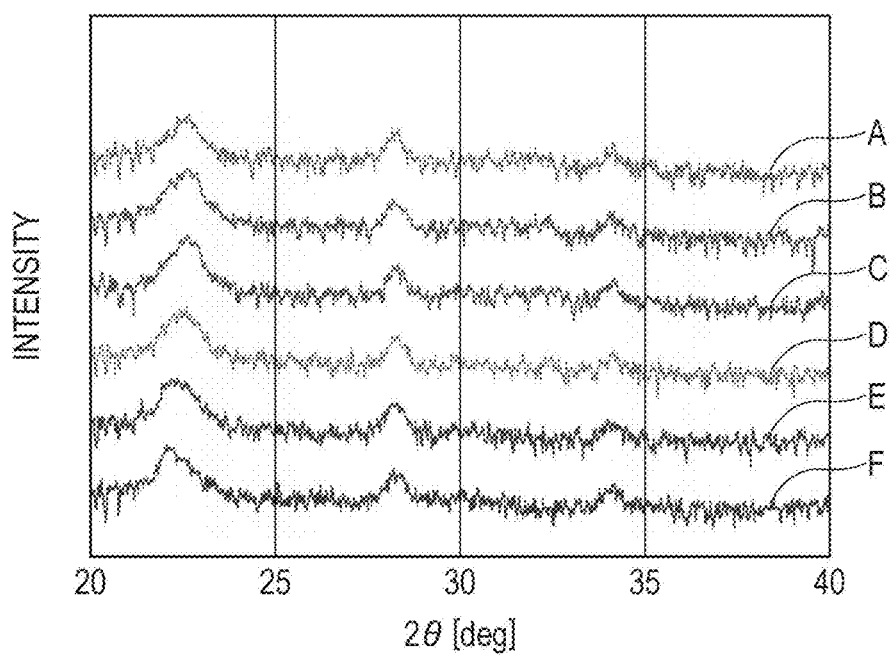
FIGS. 18A and 18B are X-ray diffraction charts of adhesion layers in Examples 4 to 9.
Figure 18B:
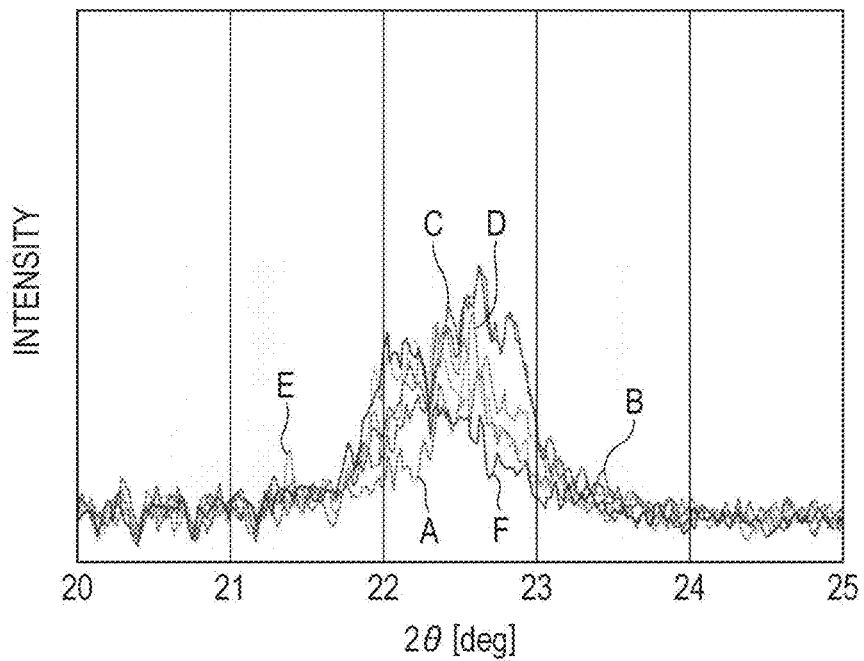

| | Adhesion layer | | | Piezoelectric | FIGS. 18A and 18B |
|---|---|---|---|---|---|
| | Bi | Fe | Ti | body layer | |
| Example 4 | 110 | 75 | 25 | BFM-MT | A |
| Example 5 | 110 | 70 | 30 | BFM-MT | B |
| Example 6 | 110 | 65 | 35 | BFM-MT | C |
| Example 7 | 110 | 60 | 30 | BFM-MT | D |

TABLE 1-continued

|  | Adhesion layer | | | Piezoelectric | FIGS. 18A and |
| --- | --- | --- | --- | --- | --- |
|  | Bi | Fe | Ti | body layer | 18B |
| Example 8 | 110 | 55 | 45 | BFM-MT | E |
| Example 9 | 110 | 50 | 50 | BFM-MT | F |

TABLE 2

Figure 19A:
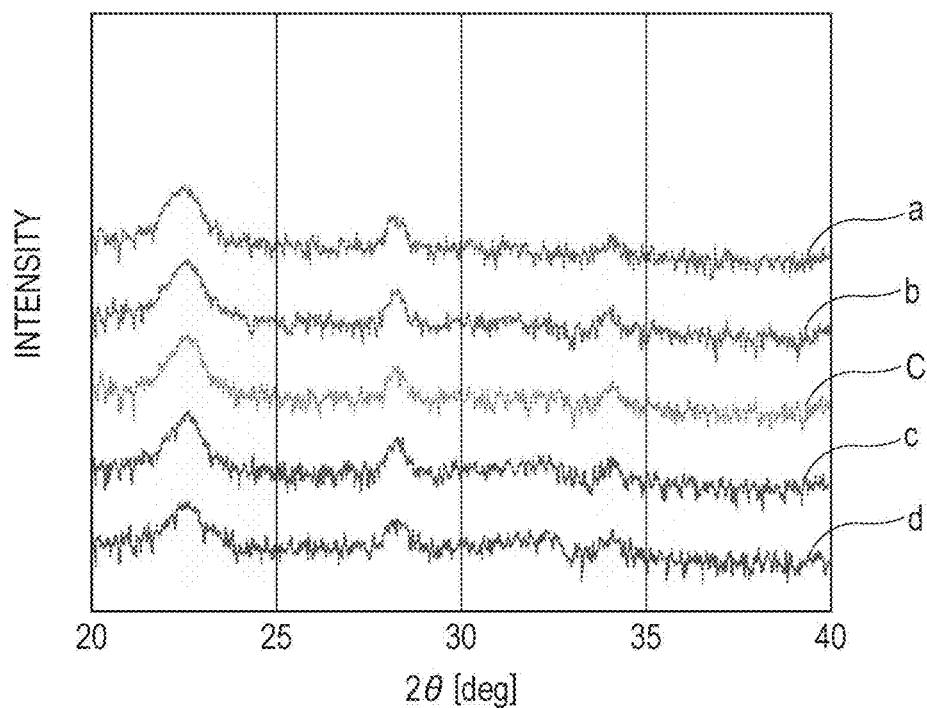
FIGS. 19A and 19B are X-ray diffraction charts of adhesion layers in Examples 10 to 13.

|  | Adhesion layer | | | Piezoelectric | FIGS. 19A and |
| --- | --- | --- | --- | --- | --- |
|  | Bi | Fe | Ti | body layer | 19B |
| Example 10 | 120 | 65 | 35 | BFM-MT | a |
| Example 11 | 115 | 65 | 35 | BFM-MT | b |
| Example 12 | 105 | 65 | 35 | BFM-MT | c |
| Example 13 | 100 | 65 | 35 | BFM-MT | d |
| Example 14 | 120 | 65 | 35 | PZT | — |

Test Example 3

An X-ray diffraction chart of adhesion layers in Example 4 to 9 is obtained by "D8 Discover With GADDS: micro region X-ray diffractometer" manufactured by Bruker AXS, using CuKα-ray as the X-ray source, at room temperature. FIGS. 18A and 18B respectively show the X-ray diffraction patterns. The peak in the vicinity of 2θ=22.5° is the peak derived from (100) face.

It was possible to understand from FIG. 18A that the adhesion layer in each of Examples 4 to 9 has perovskite structure oriented in the (100) face since the peak is observed near 22.5°. Specifically, it was possible to understand from FIG. 18B that the degree of orientation is high since the high peak intensity was obtained, in the range from Fe:Ti=70:30 to Fe:Ti=65:35.

Figure 19B:
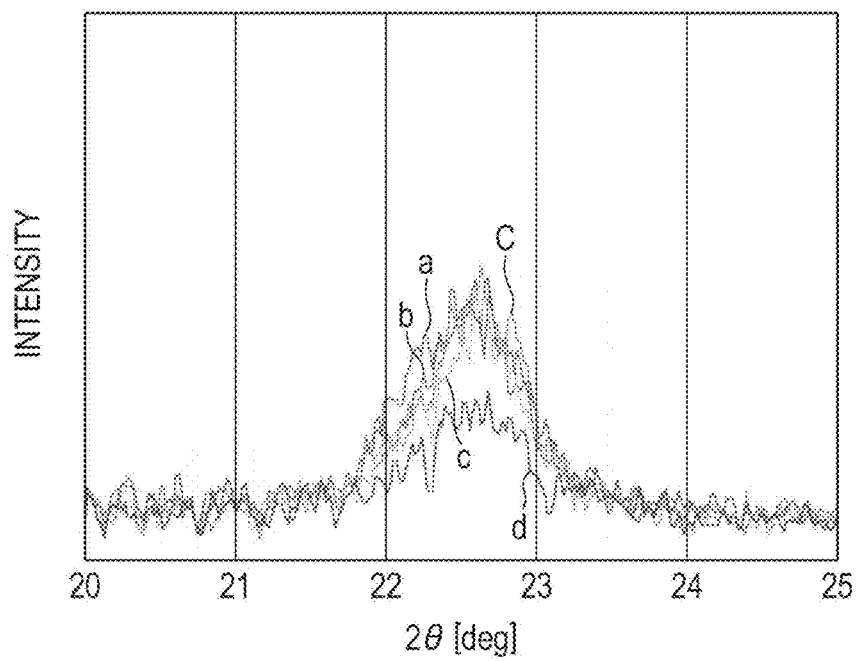

An X-ray diffraction chart of the adhesion layers in Examples 10 to 13 was obtained by the same method mentioned above. FIGS. 19A and 19B respectively show the X-ray diffraction patterns. The X-ray diffraction patterns of Example 6 are also shown in FIGS. 19A and 19B. These patterns of Example 6 are the same ones shown in FIGS. 18A and 18B.

It was possible to understand from FIG. 19A that the adhesion layer in each of Examples 10 to 13 has perovskite structure oriented in the (100) face since the peak is observed near 22.5°. Specifically, It was possible to understand from FIG. 19B that the degree of orientation is high since the high peak intensity was obtained, in the range of Bi≧110.

Test Example 4

Figure 20A:
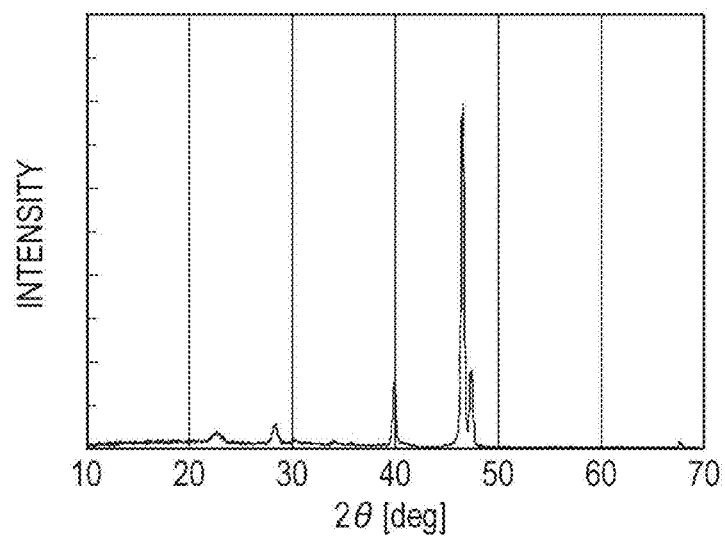
FIGS. 20A and 20B show an X-ray diffraction chart and a two-dimensional mapping of a first electrode in Example 10.
Figure 20B:
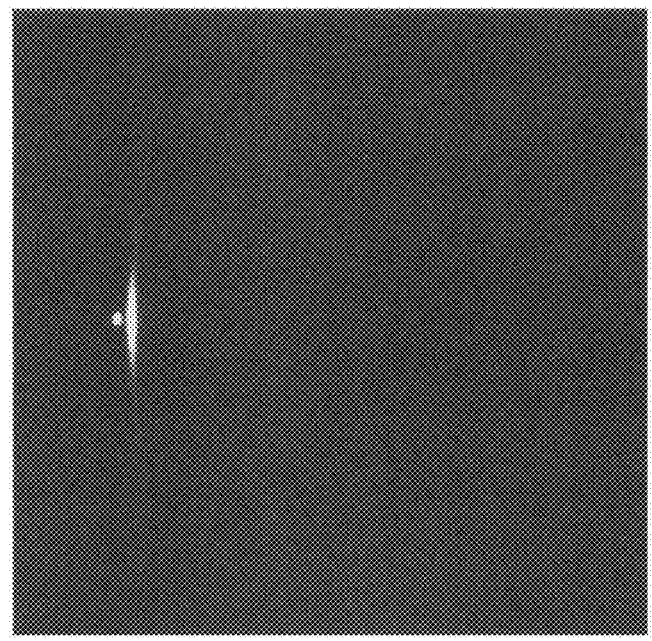

An X-ray diffraction pattern of the first electrode, which was formed on the adhesion layer (the molar ratio Bi:Fe:Ti=120:65:35) in Example 10, was obtained by the same method as that in Test Example 3. Furthermore, a two-dimensional mapping in a case of using the X-ray diffraction two-dimensional detector was measured by the same evaluation method as that in Test Example 1. The results will be shown in FIGS. 20A and 20B. It was possible to understand from FIG. 20A that the first electrode was oriented in the (100) face since a peak of the (200) face of the first electrode (Pt) was observed near 46.5°. In addition, it was possible to understand from FIG. 20B, which shows a two-dimensional mapping image of 20°≦2θ≦50°, that fluctuation of the crystals in the first electrode was small since fluctuation in the χ direction (the longitudinal direction of the two-dimensional image) was smaller than those in Examples 1 to 3 and appeared as a spot shape.

Test Example 5

Figure 21A:
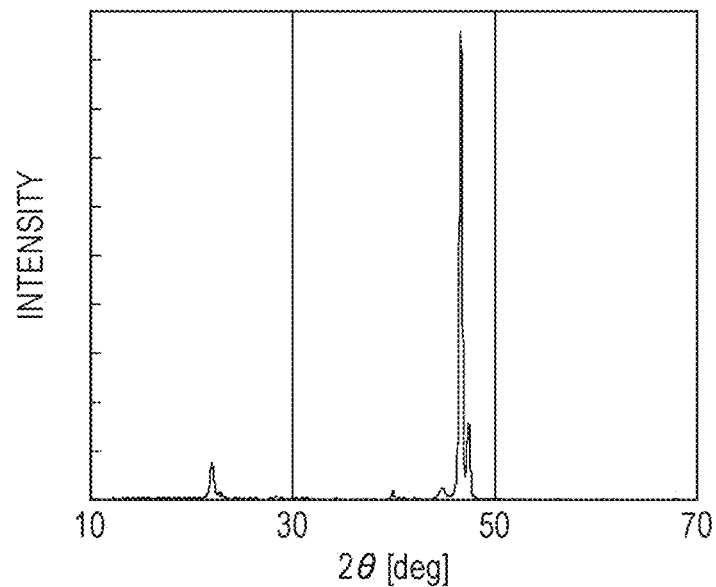
FIGS. 21A and 21B are X-ray diffraction charts of piezoelectric body layers in Examples 10 and 14.
Figure 21B:
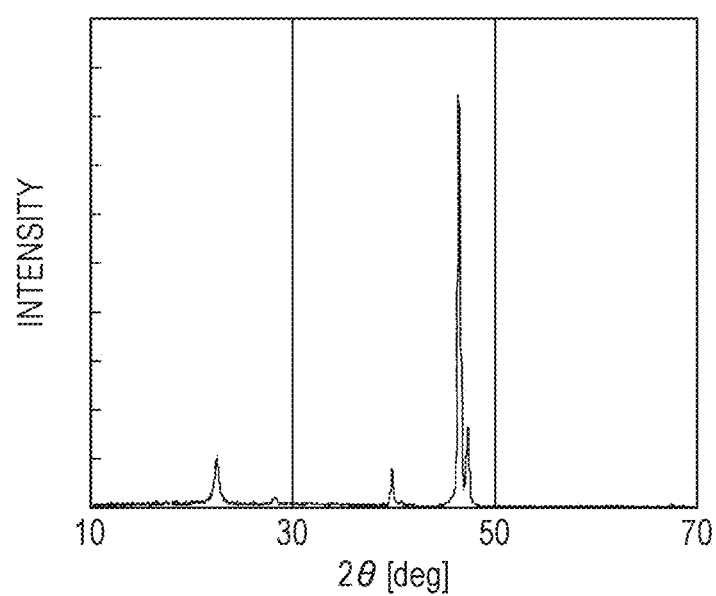

X-ray diffraction patterns of the piezoelectric body layers in Examples 14 and 10 were obtained by the same method as that in Test Example 3. FIG. 21A shows the X-ray diffraction pattern of the piezoelectric body layer (PZT) in Example 14, and FIG. 21B shows an X-ray diffraction pattern of the piezoelectric body layer (BFM-BT) in Example 10. It was possible to understand from FIGS. 21A and 21B that the piezoelectric body layers in both examples were oriented in the (100) face since diffraction peaks were observed in the vicinity of 22.0° and in the vicinity of 22.5°, respectively.

According to Examples 4 to 14, it is possible to obtain the first electrodes which are oriented in the (100) face under relatively simple process conditions without reflecting lattice information from the silicon single crystal substrate, for example. Accordingly, it is possible to avoid limitation in the types of films to be laminated on the silicon single crystal substrate and to use zirconium oxide ($ZrO_2$), which is used as a vibrating plate for an actuator between the single crystal substrate and the first electrode, for example, in terms of the crystal structure.

Although it is possible to reflect the lattice information from the silicon single crystal substrate by using an orientation control film below the adhesion layer, it is possible to reduce the number of processes and the number of laminated layers and to preferably prevent element diffusion between the respective thin films in Examples 4 to 14. Accordingly, it is possible to prevent variations in the thin film composition, and thus, troubles such as peeling off of the thin films, voids, and abnormal growth of crystals hardly occur, and fluctuation in crystals in the produced first electrode is advantageously reduced.

Other Embodiments

Although embodiments of the present invention were described above, the basic configuration of the invention is not limited to the aforementioned configuration. Although the silicon single crystal substrate was exemplified as the flow path formation substrate 10 in the above embodiments, the invention is not particularly limited thereto, and an SOI substrate or a material such as glass may be used, for example.

Furthermore, although the piezoelectric element 300 in which the orientation control layer 58, the adhesion layer 56, the first electrode 60, the piezoelectric body layer 70, and the second electrode 80 were sequentially laminated on the substrate (flow path formation substrate 10) was exemplified in the above embodiments, the invention is not particularly limited thereto. For example, it is also possible to apply the invention to a longitudinal vibration-type piezoelectric element in which piezoelectric materials and electrode formation materials are alternately laminated so as to expand and contract in an axial direction, for example.

Figure 22:
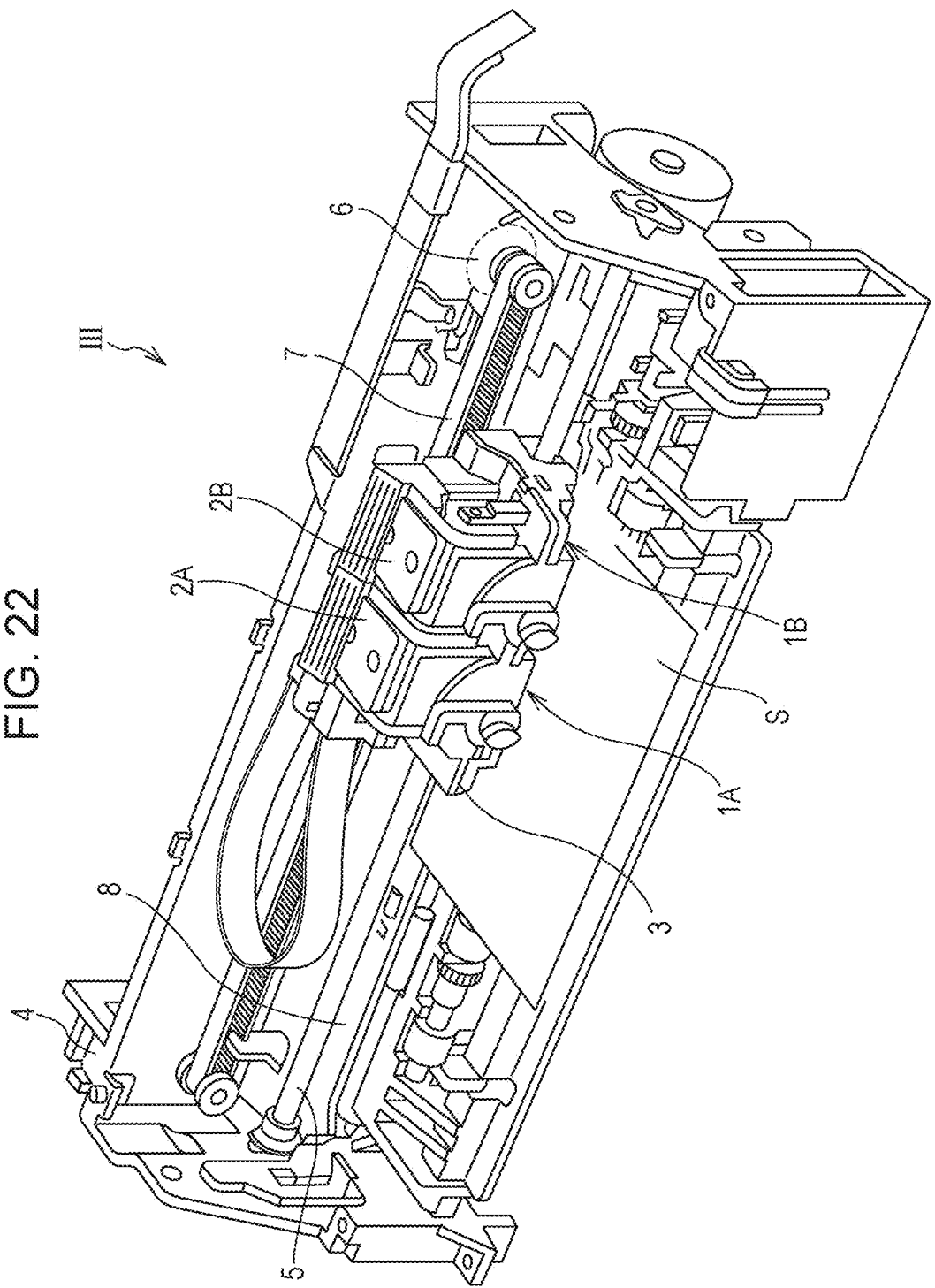
FIG. 22 is a diagram showing an outline configuration of a recording apparatus according to an embodiment of the invention.

In addition, the ink jet recording head according to the embodiments configures a part of a recording head unit which is provided with an ink flow path communicating with an ink cartridge or the like and is mounted on an ink jet recording apparatus. FIG. 22 is an outline diagram showing an example of the ink jet recording apparatus.

In an ink jet recording apparatus III shown in FIG. 22, cartridges 2A and 2B which configure ink supply mechanisms are detachably provided in recording head units 1A and 1B, each of which is provided with the ink jet recording head I, and a carriage 3 on which the recording head units 1A and 1B are mounted is provided at a carriage shaft 5 attached to an apparatus main body 4 so as to be movable in an axial direction. It is assumed that the recording head units 1A and 1B eject a black ink composition and a color ink composition, respectively.

In addition, the carriage 3 on which the recording head units 1A and 1B are mounted is moved along the carriage shaft 5 by delivering drive force from the drive motor 6 to the carriage 3 via a plurality of gears (not shown) and a timing belt 7. In contrast, a transport roller 8 as a transport mechanism is provided at the apparatus main body 4, and a recording sheet S as a recording medium such as a paper is transported by the transport roller 8. In addition, the transport mechanism for transporting the recording sheet S is not limited to the transport roller, and a belt, a drum, or the like may be used instead.

Although the ink jet recording head was described as an example of a liquid ejecting head in the above embodiments, the invention is intended to widely target general liquid ejecting heads, and it is a matter of course that the invention can be applied to liquid ejecting heads which eject liquid other than ink. Examples of other liquid ejecting heads include various recording heads used in image recording apparatuses such as a printer, colorant ejecting heads used in manufacturing color filters for a liquid crystal display and the like, electrode material ejecting heads used in forming electrodes for an organic EL display, field emission display (FED), and the like, and bioorganic substance ejecting heads used in manufacturing a bio chip.

In addition, the piezoelectric element according to the invention is not limited to a piezoelectric element used in a liquid ejecting head, and it is also possible to use the piezoelectric element in other devices. Examples of other devices include ultrasonic devices such as an ultrasonic wave generator, an ultrasonic motor, a temperature-electricity converter, a pressure-electricity converter, a ferroelectric transistor, piezoelectric transformer, and filters such as blocking filters for harmful rays such as an infrared rays, an optical filter using a photonic crystal effect by quantum dot formation and an optical filter using optical interference of a thin film. In addition, it is also possible to apply the invention to a piezoelectric element used for a sensor and to a piezoelectric element used for a ferroelectric memory. Examples of the sensors in which the piezoelectric element is used include an infrared sensor, ultrasonic sensor, a thermo-sensitive sensor, a pressure sensor, a pyroelectric sensor, and a gyro sensor (angular velocity sensor).

The entire disclosure of Japanese Patent Application Nos: 2013-200460, filed Sep. 26, 2013 and 2014-128661, filed Jun. 23, 2014 are expressly incorporated by reference herein.

What is claimed is:

1. A piezoelectric element comprising:
an adhesion layer made of composite oxide having perovskite structure including at least bismuth, iron, and titanium, the adhesion layer being preferentially oriented in a (100) face;
a first electrode provided on the adhesion layer and made of metal preferentially oriented in the (100) face;
a piezoelectric body layer provided on the first electrode and made of composite oxide having perovskite structure preferentially oriented in the (100) face; and
a second electrode provided on the piezoelectric body layer.

2. The piezoelectric element according to claim 1, wherein a molar ratio of bismuth:iron:titanium is x:65:35 where $100 \leq x \leq 120$.

3. The piezoelectric element according to claim 1, wherein the adhesion layer is provided on an orientation control layer which contains bismuth and manganese, bismuth and manganese and iron, or bismuth and iron and titanium.

4. The piezoelectric element according to claim 1, wherein the piezoelectric body layer contains bismuth, iron, barium, and titanium.

5. The piezoelectric element according to claim 1, wherein the piezoelectric body layer further contains manganese.

6. The piezoelectric element according to claim 1, wherein the piezoelectric body layer contains the same constituent elements as those in the adhesion layer.

7. The piezoelectric element according to claim 1, wherein the first electrode is made of platinum.

8. A liquid ejecting head comprising:
a flow path formation substrate which includes a pressure generation chamber communicating with nozzle openings for ejecting liquid;
a vibrating plate which is provided on one side of the flow path formation substrate; and
a piezoelectric element according to claim 1.

9. A liquid ejecting apparatus comprising:
the liquid ejecting head according to claim 8.

10. The piezoelectric element according to claim 1, wherein the adhesion layer is provided on an insulator film of which a surface shape is arranged so as to be able to preferentially orient the first electrode in the (100) face.

* * * * *